US012723305B2

(12) United States Patent
Brezoczky et al.

(10) Patent No.: US 12,723,305 B2
(45) Date of Patent: Sep. 1, 2026

(54) SHUTTER DISK SYSTEM

(71) Applicant: Applied Materials, Inc., Santa Clara, CA (US)

(72) Inventors: Thomas Brezoczky, Los Gatos, CA (US); Kirankumar Neelasandra Savandaiah, Bangalore (IN); Arun Rengaraj, Nexus @ One-North (SG); Sivakumar Ramalingam, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 404 days.

(21) Appl. No.: 18/517,404

(22) Filed: Nov. 22, 2023

(65) Prior Publication Data

US 2025/0163568 A1 May 22, 2025

(51) Int. Cl.
*C23C 14/56* (2006.01)
*C23C 14/54* (2006.01)

(52) U.S. Cl.
CPC ............ *C23C 14/566* (2013.01); *C23C 14/54* (2013.01)

(58) Field of Classification Search
None
See application file for complete search history.

(56) References Cited

U.S. PATENT DOCUMENTS 5,180,048 A 1/1993 Kawada et al.
5,569,350 A 10/1996 Osada et al.
5,641,054 A 6/1997 Mori et al.
6,157,106 A 12/2000 Tietz et al.
6,206,176 B1 3/2001 Blonigan et al.
6,231,716 B1 5/2001 White et al.
7,293,950 B2 11/2007 Bonora et al.
7,438,175 B2 10/2008 White et al.
(Continued)

FOREIGN PATENT DOCUMENTS

CN 101158852 A 4/2008
CN 113707585 A 11/2021
(Continued)

OTHER PUBLICATIONS

International Search Report and Written Opinion in related application PCT/US2023/035709 dated Feb. 5, 2024.
(Continued)

*Primary Examiner* — Alexander M Weddle
(74) *Attorney, Agent, or Firm* — Patterson + Sheridan, LLP

(57) ABSTRACT

The present disclosure provides shutter disk systems. The shutter disk systems include a body including a plurality of faces, a base, and a top. The body includes an interior volume. The interior volume includes an interlock region configured to receive at least one shutter disk. The interior volume includes an operation region adjacent to the interlock region, where the operational region is separate from the interlock region by an isolator plate. A shutter disk stack is disposed in the operational region. The shutter disk stack includes at least a storage rack configured to receive two or more shutter disks. A first door is disposed on a face of the plurality of faces proximal to the operational region. A second door is disposed proximal to the interlock region. A third door is disposed proximal to a portion of the interlock region and a portion of the operational region.

19 Claims, 7 Drawing Sheets

(56) References Cited

U.S. PATENT DOCUMENTS

| | | | |
|---|---|---|---|
| 7,841,820 | B2 | 11/2010 | Bonora et al. |
| 7,948,122 | B2 | 5/2011 | Compter et al. |
| 7,964,038 | B2 | 6/2011 | Patalay et al. |
| 7,994,486 | B2 | 8/2011 | Smick et al. |
| 8,104,951 | B2 | 1/2012 | Aderhold et al. |
| 8,851,817 | B2 | 10/2014 | Bonora et al. |
| 9,390,950 | B2 | 7/2016 | Sorabji et al. |
| 9,588,443 | B2 | 3/2017 | Shibazaki |
| 9,964,863 | B1 | 5/2018 | Babayan et al. |
| 10,204,810 | B2 | 2/2019 | Hoey et al. |
| 10,236,197 | B2 | 3/2019 | Janakiraman et al. |
| 10,256,124 | B2 | 4/2019 | Mooring |
| 10,262,887 | B2 | 4/2019 | Hao et al. |
| 10,283,397 | B2 | 5/2019 | Willwerth et al. |
| 10,460,977 | B2 | 10/2019 | Breninger et al. |
| 10,483,141 | B2 | 11/2019 | Janakiraman et al. |
| 10,490,436 | B2 | 11/2019 | Ghosh et al. |
| 10,734,265 | B2 | 8/2020 | Janakiraman et al. |
| 10,770,337 | B2 | 9/2020 | Lee et al. |
| 10,784,142 | B2 | 9/2020 | Marcelynas et al. |
| 10,851,453 | B2 | 12/2020 | Tsai et al. |
| 10,892,180 | B2 | 1/2021 | Chia et al. |
| 11,232,965 | B2 | 1/2022 | Newman et al. |
| 11,377,310 | B2 | 7/2022 | Aust et al. |
| 11,508,595 | B2 | 11/2022 | Aust et al. |
| 11,527,424 | B2 | 12/2022 | Berger et al. |
| 2002/0018842 | A1 | 2/2002 | Dunlow |
| 2002/0108842 | A1 | 8/2002 | Bonora et al. |
| 2003/0178145 | A1 | 9/2003 | Anderson et al. |
| 2003/0219977 | A1 | 11/2003 | Pomarede et al. |
| 2004/0023495 | A1 | 2/2004 | Butterfield et al. |
| 2004/0058293 | A1 | 3/2004 | Nguyen et al. |
| 2004/0255442 | A1 | 12/2004 | McDiarmid et al. |
| 2006/0102078 | A1 | 5/2006 | Fairbairn et al. |
| 2006/0156981 | A1 | 7/2006 | Fondurulia et al. |
| 2007/0160507 | A1 | 7/2007 | Satoh et al. |
| 2007/0269297 | A1 | 11/2007 | Meulen et al. |
| 2008/0175694 | A1 | 7/2008 | Park et al. |
| 2008/0232947 | A1 | 9/2008 | van der Meulen et al. |
| 2008/0266037 | A1 | 10/2008 | Williams |
| 2008/0276867 | A1 * | 11/2008 | Schaller ................ C23C 14/568 118/719 |
| 2009/0314211 | A1 | 12/2009 | Du Bois et al. |
| 2010/0062592 | A1 | 3/2010 | Clark |
| 2010/0136773 | A1 | 6/2010 | Akae et al. |
| 2010/0224482 | A1 | 9/2010 | Yamaguchi et al. |
| 2010/0226737 | A1 | 9/2010 | Sakaue et al. |
| 2011/0312189 | A1 | 12/2011 | Kim et al. |
| 2012/0109355 | A1 | 5/2012 | Baccini et al. |
| 2012/0213614 | A1 | 8/2012 | Bonora et al. |
| 2012/0249291 | A1 | 10/2012 | Holcomb et al. |
| 2013/0171757 | A1 | 7/2013 | Ponnekanti et al. |
| 2014/0020629 | A1 | 1/2014 | Tsai et al. |
| 2017/0117170 | A1 | 4/2017 | Wong et al. |
| 2018/0339816 | A1 | 11/2018 | Oldendorf et al. |
| 2018/0374732 | A1 | 12/2018 | Klein et al. |
| 2019/0345606 | A1 | 11/2019 | Hwang et al. |
| 2019/0348264 | A1 | 11/2019 | Tsai et al. |
| 2020/0026060 | A1 | 1/2020 | Takato |
| 2020/0232088 | A1 | 7/2020 | White et al. |
| 2020/0262060 | A1 | 8/2020 | Hosek et al. |
| 2020/0262660 | A1 | 8/2020 | Hosek et al. |
| 2020/0381276 | A1 | 12/2020 | Yedla et al. |
| 2021/0024929 | A1 | 1/2021 | Yokota et al. |
| 2021/0249291 | A1 | 8/2021 | Raatz et al. |
| 2021/0265188 | A1 | 8/2021 | Moura et al. |
| 2021/0296150 | A1 | 9/2021 | Berger et al. |
| 2021/0328146 | A1 | 10/2021 | Heymanns et al. |
| 2021/0354934 | A1 | 11/2021 | Aust et al. |
| 2022/0003718 | A1 | 1/2022 | Watanabe |
| 2022/0013383 | A1 | 1/2022 | Savandaiah et al. |
| 2022/0037181 | A1 | 2/2022 | Hatano et al. |
| 2022/0130700 | A1 | 4/2022 | Newman et al. |
| 2022/0208426 | A1 | 6/2022 | Aust et al. |
| 2022/0293451 | A1 | 9/2022 | Sulyman et al. |
| 2022/0293452 | A1 | 9/2022 | Sulyman et al. |
| 2022/0336258 | A1 | 10/2022 | Srivastava et al. |
| 2022/0393618 | A1 | 12/2022 | Aust et al. |
| 2022/0415635 | A1 | 12/2022 | Yedla et al. |
| 2022/0415687 | A1 | 12/2022 | Hatano et al. |
| 2022/0415688 | A1 | 12/2022 | Hatano et al. |
| 2023/0132174 | A1 | 4/2023 | Thanu et al. |

FOREIGN PATENT DOCUMENTS

| | | | |
|---|---|---|---|
| CN | 114883226 | A | 8/2022 |
| DE | 102018006259 | A1 | 12/2019 |
| EP | 1681261 | A1 | 7/2006 |
| EP | 4222779 | A1 | 8/2023 |
| JP | 62121134 | A | 6/1987 |
| JP | H06324297 | A | 11/1994 |
| KR | 10-20210081597 | A | 7/2021 |
| KR | 20220099611 | A | 7/2022 |
| KR | 1020220099611 | A | 7/2022 |
| TW | 202141675 | A | 11/2021 |
| WO | 2008077048 | A2 | 6/2008 |
| WO | 2011102410 | A1 | 8/2011 |
| WO | 2015007385 | A1 | 1/2015 |
| WO | 2015043712 | A1 | 4/2015 |
| WO | 2015140155 | A1 | 9/2015 |
| WO | 2015158725 | A1 | 10/2015 |
| WO | 2015162177 | A1 | 10/2015 |
| WO | 2015189263 | A1 | 12/2015 |
| WO | 2016162288 | A1 | 10/2016 |
| WO | 2019037858 | A1 | 2/2019 |
| WO | 2019052657 | A1 | 3/2019 |
| WO | 2019145035 | A1 | 8/2019 |
| WO | 2019238416 | A1 | 12/2019 |
| WO | 2020126040 | A1 | 6/2020 |
| WO | 2020192911 | A1 | 10/2020 |
| WO | 2021106796 | A1 | 6/2021 |
| WO | 2021106799 | A1 | 6/2021 |
| WO | 2021223843 | A1 | 11/2021 |
| WO | 2022044834 | A1 | 3/2022 |

OTHER PUBLICATIONS

International Search Report/ Written Opinion issued to PCT/US2023/079455 on Mar. 6, 2024.

Yu et al.; Controller design and implementation of six-degree-of-freedom magnetically levitated positioning system with high precision; Proc. IMechE vol. 222 Part I: J. Systems and Control Engineering; 12 pages.

Zhu et al.; Design and Control of a Six Degrees-of-Freedom Magnetically Levitated Positioning System; IFAC PapersOnLine 49-21 (2016) pp. 127-132.

Temposonics; Sensor Selector Guide; Retrieved from the Internet at: <https://www.temposonics.com/docs/temposonicslibraries/literature/sensor_selector_guide_industrial_551814_en.pdf?sfvrsn=5fde8874_12>; 21 pages.

Linear Motion Tips; How do Magnettostrictive sensors work?; Retrieved from the Internet at: <https://www.linearmotiontips.com/how-do-magnetostrictive-sensors-work/> 9 Pages.

U.S. Appl. No. 18/081,493, filed Dec. 14, 2022.

U.S. Appl. No. 18/141,909, filed May 1, 2023.

U.S. Appl. No. 18/141,914, filed May 1, 2023.

U.S. Appl. No. 18/141,920, filed May 1, 2023.

U.S. Appl. No. 18/141,923, filed May 1, 2023.

U.S. Appl. No. 18/141,926, filed May 1, 2023.

U.S. Appl. No. 18/141,931, filed May 1, 2023.

U.S. Appl. No. 18/417,510, filed Jan. 19, 2024.

International Search Report dated Dec. 16, 2024, re: PCT Application No. PCT/US/2024/047197.

* cited by examiner

SHUTTER DISK SYSTEM

BACKGROUND

Field

Embodiments described herein generally relate to substrate processing and, more particularly, to a substrate processing module and a method of moving a workpiece.

Description of the Related Art

Conventional cluster tools are configured to perform one or more processes during substrate processing. For example, a cluster tool can include a physical vapor deposition (PVD) chamber to perform a PVD process on a substrate. Cluster tools may use transfer systems to move substrates between a process chamber of a plurality of process chambers within the cluster tool. For example, carousel systems with multiple arms are used to grasp and or support either substrates or shutter discs. Rotating the carousel system moves the workpieces in and out of the various processing chambers or processing positions within the cluster tool. The carousel typically has different arms that each include a different form and function, depending on the desired workpiece to be grasped or supported.

In a PVD process, for example, for depositing dielectric materials, a conductive material coating may be applied (e.g., pasted) on inner surfaces of a PVD chamber to minimize particle formations in the inner surfaces of the chamber. During such pasting processes, chamber components need to be protected from deposition of the pasting material via a protective disc (also referred to as a shutter disk). However, one conventional disadvantage while processing substrates in multiple PVD chambers in a single cluster tool system relates to reduced mechanical throughput of the system as time must be allowed for ramping up, performing and ramping down each deposition process and each pasting process.

The process chambers and the substrate transfer system of the processing system is held at vacuum pressure during processing. However, conventional places used to store shutter disks are often located in expensive real-estate regions of the cluster tool, such as the high vacuum portions of the cluster tool. The need for this extra space to house the shutter disks within the high vacuum regions of the system increase the size and footprint of the system which greatly increases the system cost and amount of the fab space used to house the system.

Accordingly, there exists a need for further improvements in systems and methods that utilize shutter disks as part of a deposition sequence performed within a cluster tool. There is also a need to a system and methods that overcome the various challenges described above.

SUMMARY

The present disclosure provides shutter disk systems. The shutter disk systems include a body including a plurality of faces, a base, and a top. The body includes an interior volume. The interior volume includes an interlock region configured to receive at least one shutter disk. The interior volume includes an operation region adjacent to the interlock region, where the operational region is separate from the interlock region by an isolator plate. A shutter disk stack is disposed in the operational region. The shutter disk stack includes at least a storage rack configured to receive two or more shutter disks. A first door is disposed on a face of the plurality of faces proximal to the operational region. A second door is disposed proximal to the interlock region. A third door is disposed proximal to a portion of the interlock region and a portion of the operational region.

The present disclosure also provides substrate processing systems. The substrate processing systems include two or more process stations. A factory interface is coupled to the two or more process stations. A shutter disk system is coupled to the factory interface. The factory interface is disposed between the two or more process stations and the shutter disk system. The shutter disk system includes a body including a plurality of faces, a base, and a top. The body includes an interior volume. The interior volume includes an interlock region configured to receive at least one shutter disk. The interior volume includes an operation region adjacent to the interlock region, where the operational region is separate from the interlock region by an isolator plate. A shutter disk stack is disposed in the operational region. The shutter disk stack includes at least a storage rack configured to receive two or more shutter disks. A first door is disposed on a face of the plurality of faces proximal to the operational region. A second door is disposed proximal to the interlock region. A third door is disposed proximal to a portion of the interlock region and a portion of the operational region.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to substrate transfer systems, including the use of a shutter disk system that stores one or more shutter disks under vacuum during operation. The shutter disk system can be mounted to a load port location of a factory interface of the substrate transfer system. The shutter disk system allows for routine maintenance and switching of shutter disks without the need to break vacuum. The shutter disk system can be utilized to enable a plurality of deposition processes to be performed within the system (e.g., cluster tool) before the vacuum portions of the system will need to be maintained. Overall, the substrate transfer system of the present disclosure allows for routine maintenance to be performed on one or more shutter disks without the need to break vacuum or extended the length of pump down sessions, reducing costs.

Substrate Processing System Example

Figure 1:
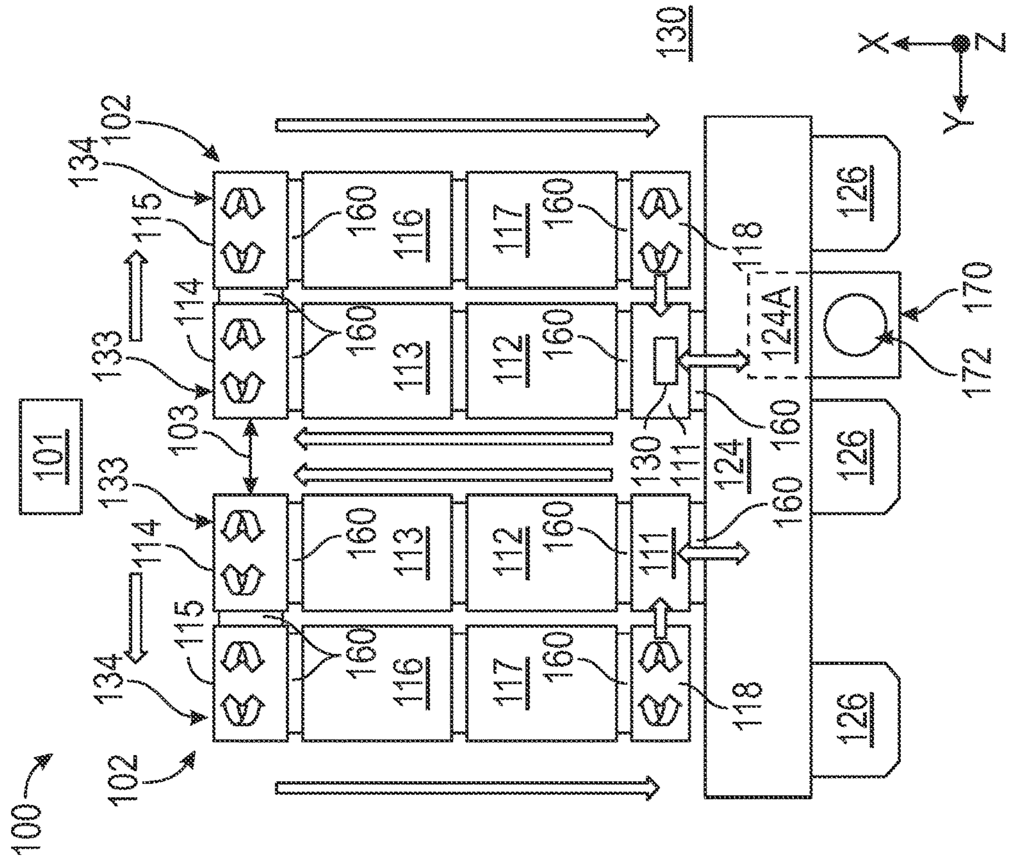
FIG. 1 illustrates a top schematic view of an example substrate processing system, in accordance with embodiments of the present disclosure.

FIG. 1 illustrates a top schematic view of an example substrate processing system 100, in which embodiments of the present disclosure may be implemented. The substrate processing system 100 includes a controller 101 and one or more processing lines 102.

The one or more processing lines 102 each include a plurality of stations, as illustrated in FIG. 1. In one example, the processing line 102 illustrated on the right side of FIG. 1 includes at least four processing stations 112, 113, 116 and 117, the processing line 102 illustrated on the left side of FIG. 1 includes at least four processing stations 112, 113, 116 and 117. However, processing stations 111, 114 and 115 may also be configured to perform one or more substrate processing processes. Each processing line 102 may include a magnetic transportation system (not shown) that include a plurality of individual magnetic levitation assemblies disposed within the stations 111-118 that are configured to convey an object 140 (FIG. 3A) disposed on a carrier 130 (FIGS. 2A-2B and 3A-3B) through the processing line 102. Each processing line 102 may be independent of other processing lines 102. The processing lines 102 may be physically separated by one another by a gap 103. The gap 103 may be sized such that a technician may walk between each processing line 102 to service the one or more stations 111-118.

Each processing line 102 may include a plurality of slit valves 160 to selectively isolate each station 111-118. The slit valves 160 may be selectively opened and closed to allow a clear path for the travel of the carrier 130, to selectively isolate the stations 111-118 from one another, and to facilitate the pressurization or depressurization of the stations 111-118.

The substrate processing system 100 may be used to process multiple substrates in each processing line 102 to produce a desired fabricated substrate. In some cases, the substrate processing system 100 may include a plurality of physical vapor deposition (PVD) processing chambers. For example, the first station 111 may be a first load lock station, the second station 112 may be a degas station, the third station 113 may be a pre-clean station, the fourth station 114 may be a routing station, the fifth station 115 may be a routing station, the sixth station 116 may be a PVD tantalum nitride deposition station, the seventh station 117 may be a PVD copper deposition station, and the eighth station 118 may be a routing station that also serves as a buffer station. An object 140 (e.g., substrate) may be transferred and processed within each process station 112-113 and 116-117. The magnitude of a vacuum within each station 111-118 may increase from station to station. For example, the magnitude of the vacuum in the seventh station 117 may exceed the magnitude of a vacuum in the other stations (e.g., stations 111-116 and 118).

The first station 111 (e.g., load lock station) may have a magnetic levitation assembly 120 (not shown), which includes one or more magnetic levitation actuation assemblies 120A that include a plurality of linear stators 230 (FIG. 2B) and optionally a plurality of sensors 270. As will be discussed further below, the stations 111-118 will each typically include two or more magnetic levitation actuation assemblies 120A that are spaced apart within each of the stations 111-118 to support the carrier 130 as the carrier 130 is transferred through the station. The stations 112-113 and 116-117 (e.g., process stations) may each have a magnetic levitation assembly 120 (not shown). The fourth station 114, fifth station 115, and eighth station 118 (e.g., routing stations) may each have a magnetic levitation assembly 120.

The magnetic levitation assembly 120 of the first station 111 and the magnetic levitation assembly 120 of the eighth station 118 may cooperate to change the transfer direction (e.g., X-direction to Y-direction) of the carrier 130 within the substrate processing system 100. Additionally, the magnetic levitation assembly 120 of the fourth station 114 and the magnetic levitation assembly 120 of the fifth station 115 may cooperate to change the transfer direction of travel of the carrier 130.

FIGS. 1, 2A, 2B, 3A, and 3B include an X-Y-Z coordinate system to illustrate the transfer directions of the carrier 130, shutter disk 172, and/or object 140 through the substrate processing system 100, as well as the orientation of the carrier (e.g., carrier 130, 300A, 300B). The arrows illustrate the direction that one or more carriers 130 circulate within the processing line 102. During an example processing operation, a handler is positioned in a factory interface 124, the handler is positioned to transfer an object 140 or a shutter disk 172 from one or more front opening unified pods (FOUPS) 126 or a shutter disk system 170 to the carrier 130. The carrier 130 receives the object 140 or a shutter disk 172 entering the first station 111 in the X-direction from the handler and is subsequently conveyed to the second station 112 in the X-direction.

The first station 111 also receives the carrier 130 from the eighth station 118 in the Y-direction. After the carrier 130 is conveyed into the second station 112, the carrier 130 is conveyed to the fourth station 114 through the third station 113 in the X-direction. The carrier 130 is then conveyed from the fourth station 114 to the fifth station 115 in the Y-direction. The carrier 130 is then conveyed from the fifth station 115 to the eighth station 118 in the negative X-direction through the stations 116-117. The carrier 130 is then conveyed in the Y-direction back into the first station 111. Where the carrier is carrying an object 140, the now fabricated object 140 may then be transferred back to the FOUP 126 via the handler. Where the carrier is carrying a shutter disk 172, the shutter disk 172 may be transferred back to the shutter disk system 170 via the handler. Another object 140 or shutter disk 172 may then be placed onto the carrier 130 in the first station 111 for another processing operation.

In some embodiments of the substrate processing system 100, the processing line 102 has a non-deposition portion 133 and a deposition portion 134. The non-deposition portion 133 may include a linear arrangement of stations, such as the first station 111, the second station 112, the third station 113, and the fourth station 114, that do not subject the object 140 or shutter disk 172 to a process that deposits a layer on the object 140 or shutter disk 172. After the object 140 or shutter disk 172 passes through the non-deposition portion 133, the object 140 or shutter disk 172 is conveyed into the deposition portion 134 that may be a linear arrangement of stations, such as the fifth station 115, the sixth station 116, the seventh station 117, and the eight station 118, that includes at least one station that deposits at least one layer the object. For example, the non-deposition portion 133 includes the first station 111 that is a first load lock, the second station 112 that is a degas station, the third station 113 that is a pre-clean station, and the fourth station 114 that is a routing station. The deposition portion 134 includes the fifth station 115 that is a routing station, the sixth station 116 that is a tantalum nitride deposition station, the seventh station 117 that is a copper deposition station, and the eighth station 118 that is a routing station that also serves as a buffer station.

Figure 2A:
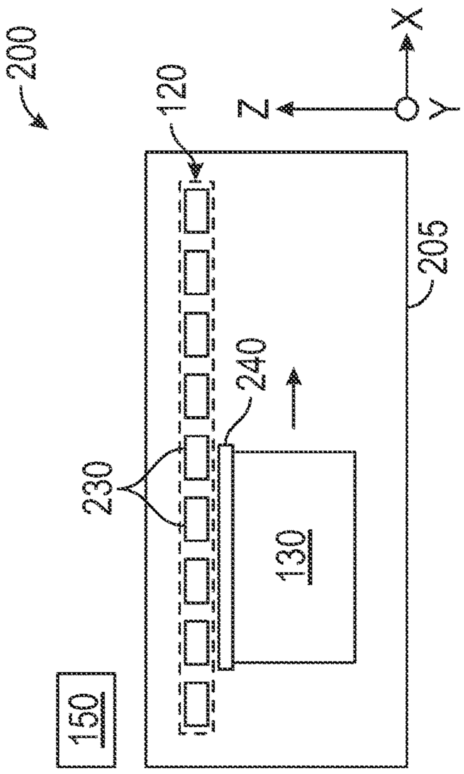
FIGS. 2A and 2B illustrate side views of a portion of an example station of the substrate processing system of FIG. 1, in accordance with embodiments of the present disclosure.
Figure 2B:
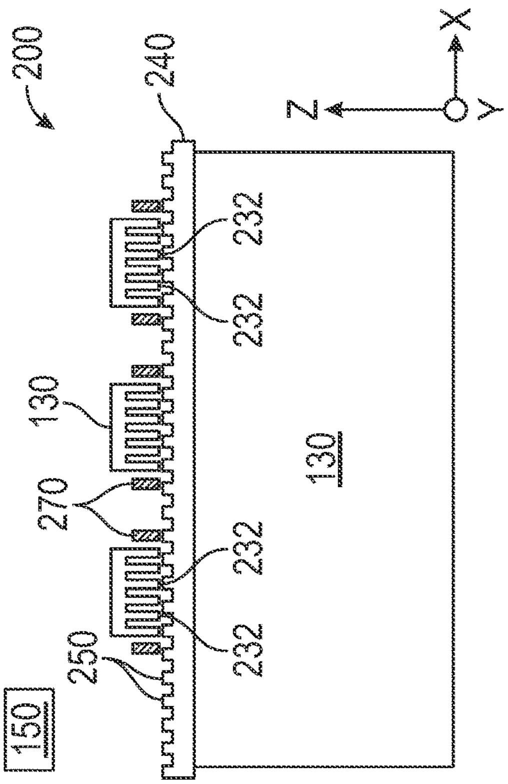

FIGS. 2A and 2B illustrate side views of a portion 200 of an example process station (e.g., stations 112-113 and 116-117) of the substrate processing system 100 of FIG. 1, in which embodiments of the present disclosure may be implemented. The example process station, which may be the process station 112-113, 116-117 described above, may be referred to herein as simply the process station 205 for clarity. The process station 205 may be configured for contactless transportation of the carrier 130. The process station 205 may include a processing chamber that is maintained at a vacuum pressure, such that the processing region of the chamber is at a pressure that is less than 760 Torr, or even at a pressure between 1 milliTorr (mTorr) and 500 Torr. The process station 205 may be configured for contactless transportation of the carrier 130 in a vacuum chamber disposed below the processing chamber, or also referred to herein as a processing station.

Figure 3A:
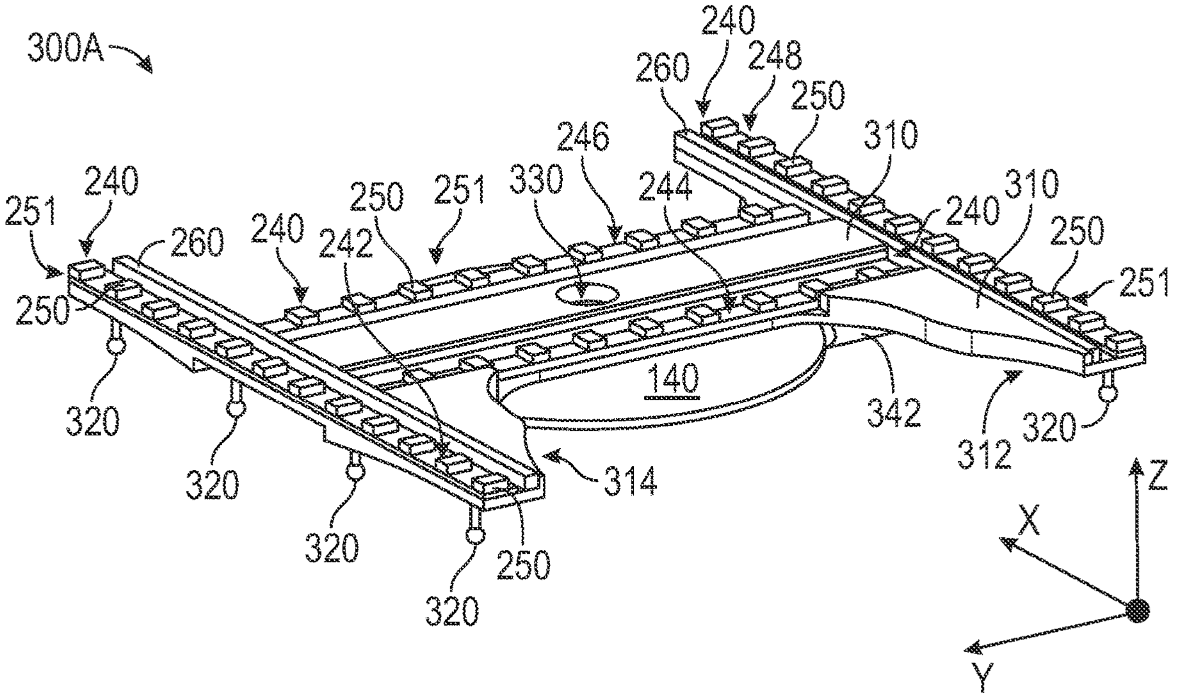
FIG. 3A illustrates an example carrier that includes a base and magnetic levitation elements, in accordance with embodiments of the present disclosure.
Figure 3B:
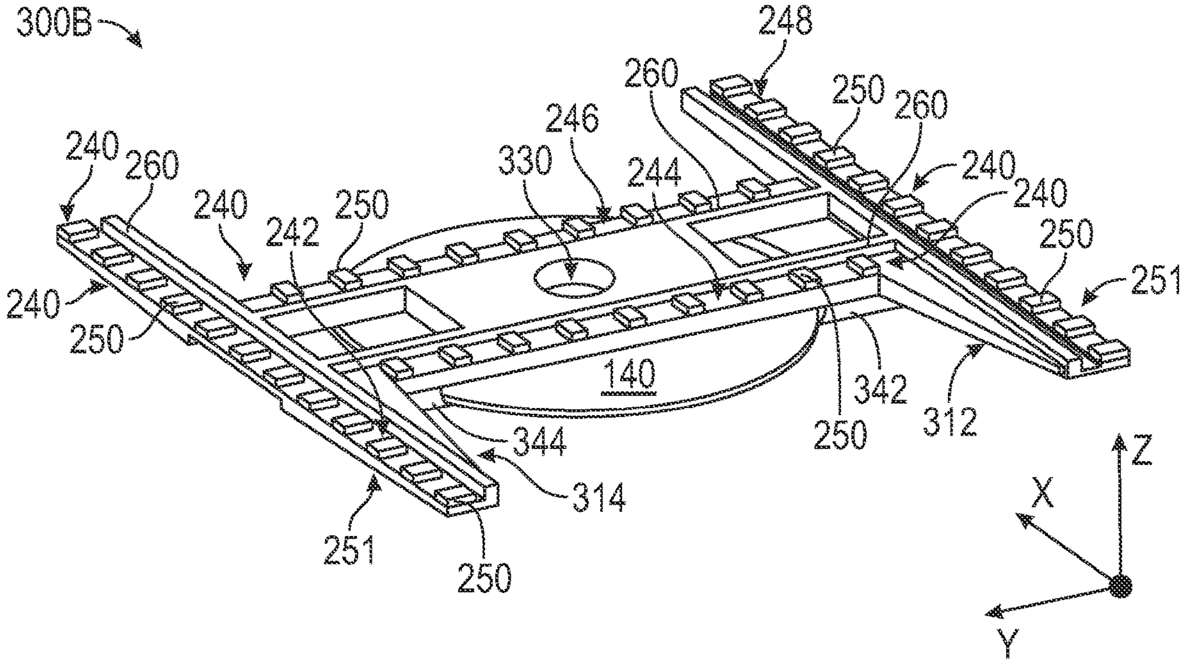
FIG. 3B illustrates an example carrier that includes magnetic levitation elements, in accordance with embodiments of the present disclosure.

The carrier 130 may be configured to carry one or more objects 140. For example, the carrier 130 may be a substrate carrier, a shutter disk carrier or a mask carrier. The carrier 130 may also be configured to transport process kit component parts. The carrier 130 may be transported in the X-direction or negative X-direction, as illustrated in FIG. 2A. The carrier 130 may also be transported in the Y-direction or negative Y-direction, as described above. In some cases, the object 140 or shutter disk 172 may be carried below the carrier 130 during transport, as illustrated in FIGS. 3A and 3B.

The carrier 130 includes one or more magnetic levitation elements 240 that allow the carrier 130 to be levitated and transported through the process station 205. The magnetic levitation element 240 may be a track in the X-direction or the Y-direction. The magnetic levitation element 240 may be a substantially straight magnetic levitation element 240, or may at least include one or more straight portions that allow the carrier 130 to be contactlessly transported through the substrate processing system 100. The magnetic levitation element 240 may define a transportation direction (or transport direction), along which the carrier 130 is contactlessly transported. In one example, as illustrated in FIG. 2A, the carrier 130, which includes one or more magnetic levitation elements 240, is transferred through the process station 205, and to and from other adjacent process stations 205 (not shown), by magnetic levitation, without the carrier 130 contacting the walls or components within the processing station 205.

As illustrated in FIG. 2A, the process station 205 includes a magnetic levitation assembly 120 that includes a plurality of magnetic levitation actuator assemblies 120A. The magnetic levitation actuator assemblies 120A will each include a plurality of linear stators 230. For example, a magnetic levitation actuator assembly 120A may include two or more, three or more, five or more, or 10 or more linear stators 230, depending on the desired length of the magnetic levitation elements 240, which is often referred to herein as a magnetic levitation element 240. Alternatively, the magnetic levitation actuator assemblies 120A of the magnetic levitation assembly 120 may include one elongated linear stator 230 extending along the entire length of a magnetic levitation element 240. The number of linear stators 230 shown in FIGS. 2A and 2B are examples, and a greater or lesser number of linear stators 230 may be used.

The linear stator 230 may be arranged to guide a corresponding magnetic levitation element 240 of the carrier 130, which is disposed underneath the linear stator 230. For example, a plurality of linear stators 230 may be disposed one after the other in a row, such as shown in FIG. 2A, extending in the X and/or Y-direction. The one or more linear stators 230 may be configured to remain stationary during contactless transportation of the carrier 130 along the magnetic levitation element 240 since the one or more linear stators 230 are coupled to a wall (e.g., top wall or side wall) of the process station 205.

The one or more linear stators 230 may include a plurality of stator poles 232, such as 2, 4, 6, 8 or more stator poles 232, as illustrated in FIG. 2B. The number of stator poles 232 shown in FIGS. 2A and 2B are examples, and a greater or lesser number of stator poles 232 may be used. The stator poles 232 may be protrusions, or teeth, that may project towards the carrier 130 and/or towards a magnetic levitation element 240 attached to the carrier 130. The plurality of stator poles 232 may define at least one comb structure. In some embodiments, a linear stator 230 may include two comb structures, each having a plurality of stator poles 232.

The magnetic levitation assembly 120, which includes the one or more linear stators 230, and the stator poles 232, may include, or be made of, a magnetic material, more specifically a ferromagnetic material. The magnetic material may be a non-permanent, or soft, magnetic material. The magnetic material may be a metal, such as electrical steel, silicon steel, ferritic steel, martensitic steel, or any other soft magnetic material.

The magnetic levitation element(s) 240 of the carrier 130 may include, or be made of, a magnetic material, such as a ferromagnetic material. The magnetic material may be a non-permanent, or soft, magnetic material. The magnetic material may be a metal, such as electrical steel, silicon steel, ferritic steel, martensitic steel, or any other soft magnetic material.

In some embodiments, as shown in FIG. 2A, the carrier 130 may be levitated and contactlessly transported in the X or Y-direction through the substrate processing system 100, for example when the carrier 130 is a substrate carrier for a large area substrate or a mask carrier carrying a mask for a large area substrate. The magnetic levitation element 240 is coupled to a portion of the top of the carrier 130, as illustrated. The magnetic levitation assembly 120, or at least a portion thereof, may be disposed above the carrier 130.

The carrier 130 is configured to be levitated and transported along the length of the magnetic levitation assembly 120 by use of the one or more linear stators 230 of the magnetic levitation assembly 120 that remain stationary within the process station 205. During contactless levitation and/or transportation of the carrier 130, the magnetic levitation element 240 faces at least one linear stator 230. The magnetic levitation element 240 may respectively face different linear stators 230 as the carrier 130 is transported along the magnetic levitation element 240.

The magnetic levitation element 240 may include an array of features 250. Any number of features 250 may be formed within an array of features 251. The features 250 may be protrusions, or teeth, that may project towards at least one linear stator 230 of the opposing magnetic levitation actuation assembly 120A. The raised segments of features 250, which include a magnetic material, may define a comb-like structure as illustrated in FIGS. 2B and 3A-3B. Each magnetic levitation element 240 may also include a featureless portion 260 adjacent to each array of features 250. The featureless portion 260 may span the same or part of the length of the array of features 251. The featureless portion 260 may be substantially flat (e.g., a flat surface) that the sensors 270 uses to measure and/or or detect a position of the carrier 130 during contactless levitation and/or transportation.

According to some embodiments, the one or more linear stators 230 of the magnetic levitation assembly 120 include a set of electromagnets. In light thereof, the one or more linear stators 230 are active magnetic systems that can provide an adjustable, controllable magnetic field. For example, each stator pole 232 of the linear stator 230 may include an electromagnet. The electromagnet may include a respective coil wound around each stator pole 232. Different winding schemes for winding the coils around each stator pole 232 may be provided. For example, the coils may be wound vertically, in that the coils are wound from top to bottom (clockwise) or from bottom to top (counter-clockwise). In some embodiments, the magnetic levitation element 240 may not include an electromagnet. The magnetic levitation element 240 may be a magnetically passive system, wherein the magnetic levitation element 240 is formed from a ferromagnetic material, without any electromagnets mounted thereon. In some embodiments, the magnetic levitation element 240, or at least the features 250 formed thereon, include a ferromagnetic material such as a material selected from a group comprising transition metals (e.g., iron, nickel, cobalt) and their alloys, and alloys of rare-earth metals. In one example, the magnetic levitation element 240 includes a ferritic stainless steel, such as a 409, 430 and 439 stainless steel. The magnetic levitation element 240 may also include an electrical steel, silicon steel, martensitic steel, or any other soft magnetic material.

In some embodiments, the magnetic levitation assembly 120 includes two parallel magnetic levitation actuator assemblies 120A running in the X-direction configured to levitate carrier 130 and convey the carrier 130 in either the positive or negative X-direction. The carrier 130 similarly includes two parallel magnetic levitation elements 240 running in the X-direction. Each magnetic levitation element 240 is positioned on the carrier 130 to be directly underneath the one or more linear stators 230 of a respective magnetic levitation actuator assembly 120A running in the X-direction when the carrier is being conveyed in the X-direction. Additionally, the magnetic levitation assembly 120 may also include two parallel magnetic levitation actuator assemblies 120A running in the Y-direction configured to levitate the carrier 130 and convey the carrier 130 in either the positive or negative Y-direction. The carrier 130 similarly includes two parallel magnetic levitation elements 240 running in the Y-direction. Each magnetic levitation element 240 is positioned on the carrier 130 to be directly underneath the one or more linear stators 230 of a respective magnetic levitation actuator assembly 120A running in the Y-direction when the carrier 130 is being conveyed in the Y-direction. As the carrier 130 moves in the Y-direction, the magnetic levitation elements 240 running in X-direction move out of alignment with the corresponding magnetic levitation actuator assemblies 120A running in the X-direction. The magnetic levitation actuation assemblies 120A running in the Y-direction are able to maintain levitation as the carrier 130 is moved in the Y-direction. The carrier 130 may be conveyed in the Y-direction to another station (e.g., from the fourth station 114 to the fifth station 115) until the magnetic levitation elements 240 running in the X-direction become aligned with corresponding magnetic levitation actuator assemblies 120A running in the X-direction where the carrier 130 may then be conveyed again in the X-direction.

The process station 205 may include a controller 150. The controller 150 may be connected to the set of electromagnets of the linear stators 230 for controlling a current in the electromagnets. The current can be increased to increase the attraction force of the set of electromagnets to raise the carrier 130 or decreased to lessen the attraction force of the set of the electromagnets to lower the carrier 130.

The controller 150 as described herein may be a single centralized controller or may be a distributed controller including a plurality of individual control units. The controller 150 may include a central processing unit (CPU), a memory and, for example, support circuits. To facilitate control of the carrier 130, the CPU may be one of any form of general-purpose computer processor that can be used in an industrial setting for controlling various components and sub-processors. The memory may be coupled to the CPU. The memory, or a computer readable medium, may be one or more readily available memory devices such as random-access memory, read only memory, a floppy disk, a hard disk, or any other form of digital storage either local or remote. The support circuits may be coupled to the CPU for supporting the processor in a conventional manner. The circuits in question include cache, power supplies, clock circuits, input/output circuitry and related subsystems, and the like.

The one or more linear stators 230 including the electromagnets may, together with the magnetic levitation element 240, form a linear reluctance motor for providing both a contactless levitation and a contactless drive of the carrier 130. A linear reluctance motor is configured for providing a linear motion, or translational motion, of the carrier 130. A linear motor is distinguished from a rotary motor, which provides a rotational motion. The linear reluctance motor of the apparatus according to embodiments described herein provides a linear motion of the carrier 130 along the magnetic levitation assembly 120.

The process station 205 may include one or more sensors 270 for measuring or detecting a position of the carrier 130 during contactless levitation and/or transportation. For example, sensors 270 may be provided on opposite ends of each linear stator 230. Each sensor 270 may be configured to detect the presence of the carrier 130. Each sensor 270 may also be configured to measure a position of the carrier 130, which may include a vertical position and/or a horizontal position of the carrier 130, for example a horizontal position with respect to the transportation direction. The sensors 270 may be Hall effect based sensors, optical sensors, ultrasonic sensors, capacitive sensors, Eddy current sensors and the like. Each sensor 270 may be connected to the controller 150. The sensors 270 may also be configured to determine the presence of and/or size of an object 140 (FIG. 3A) being transported by the carrier 130. The sensors 270 may be high-precision sensors that have a sensor resolution of 100 μm or less, particularly 10 μm or less. Accordingly, the carrier 130 may be positioned vertically and/or horizontally in a target position with high precision. In some embodiments, the sensors 270 are included in the magnetic levitation assemblies 120.

The process station 205 according to embodiments described herein may include one or more sensors 270 for detecting a position of the carrier 130 with respect to a transportation direction of the carrier 130. The controller 150 may be configured to control the reluctance-based drive force in response to a signal provided by the one or more sensors 270 to position the carrier 130 in a target position with respect to the transportation direction. The reluctance-based drive force may be configured to align the carrier 130 along the magnetic levitation element 240 or transport direction. By controlling amplitude and phase angle of an AC signal provided to the coils coupled to the stator poles 232, the dynamic motion characteristics of the magnetic levitation elements 240 and thus the carrier 130, such as the amount of jerk, acceleration, velocity, and finally horizontal position can be adjusted and achieved.

Carrier Configuration Examples

FIG. 3A illustrates an example carrier 300A that includes a base 310 and the magnetic levitation elements 240 of FIGS. 2A and 2B, in accordance with embodiments of the present disclosure. In some embodiments, the carrier 130 described above may be implemented as the carrier 300A. The carrier 300A of FIG. 3A may be similar to the carrier 130 of FIGS. 2A-2B, and everything discussed herein with respect to the carrier 130 may also apply to the carrier 300A.

In some embodiments, the magnetic levitation element 240 of the carrier 300A may be coupled to the base 310. The carrier 300A may include an array of legs 320 disposed below and/or coupled to the base 310 or magnetic levitation element 240. The carrier 300A may also include an opening 330 in the base 310. The carrier 300A may further include one or more substrate support members (e.g., support members 342 and 344 (not shown in FIG. 3A)) coupled to the base 310. Although the object 140 is illustrated in FIGS. 3A and 3B as a substrate, the carrier 300A may also be configured to carry other objects such as the shutter disk 172. For example, the carrier may be configured to carry a mask, shutter disk, process kits parts, or other objects used in semiconductor processing, as described above. The carrier 130 may also be configured to transport shutter disks 172 or process kits parts.

The magnetic levitation elements 240 of the carrier 300A may be configured to be associated with an Eigen frequency of at least 200 hertz (Hz), which relates to the inductance associated with the interaction of the magnetic fields generated by the coils within the linear stators 230 and a magnetic levitation element 240. An Eigen frequency of at least 200 Hz may enable the controller 150 of the process station 205 to more easily control the levitation and transportation of the carrier 300A. For example, the thickness of at least a portion of the magnetic levitation element 240 together with the base 310 in the center of the carrier 300A may be at least 15-20 mm to enable the carrier 300A to have an Eigen frequency of at least 200 Hz.

In some embodiments, the magnetic levitation element 240 may include or be implemented as one or more rails (e.g., rails 242, 244, 246, 248). The rails 242, 244, 246, 248 may each be aligned in a certain direction relative to the base 310. In some cases, the magnetic levitation element 240 of the carrier 300A may include a first rail 242 aligned in a first direction (e.g., the X-direction). The magnetic levitation element 240 may also include a second rail 244 aligned in a second direction (e.g., the Y-direction). The magnetic levitation element 240 may also include a third rail 246 aligned in the Y-direction and is aligned parallel to the second rail 244. The magnetic levitation element 240 may also include a fourth rail 248 aligned in the X-direction, and is aligned parallel to the first rail 242. Although the carrier 300A in FIG. 3A is illustrated as having four rails 242, 244, 246, 248, however, any number of rails may be used in the carrier 300A. In some cases, the carrier 300A may include just the first rail 242 aligned in the X-direction and the second rail 244 aligned in the Y-direction. In some embodiments, the second rail 244 and the third rail 246 may be considered and/or implemented as a single rail.

The dimensions of the carrier 300A (including the base 310 and the rails 242, 244, 246, 248) may be based on at least one of the size of the stations 111-118, the location of the sensors 270 in the stations 111-118, or the size of the objects (e.g., the object 140) being transported by the carrier 300A. The dimensions of the carrier 300A may also be selected to facilitate the stability of the carrier 300A during transportation of the object(s) 140, as well as ensure the stability of the carrier 300A when nothing is transported. The carrier 300A may be also be configured to be large enough to support the object 140 (or multiple objects 140, as described below) and small enough to pass into, through, and out of stations (e.g., stations 111-118) of a substrate processing system (e.g., substrate processing system 100), as described above.

The features 250 may be arranged on the rails 242, 244, 246, 248. The features 250 may also be arrange side by side. As illustrated in FIG. 3A, the array of features 250 of the first rail 242 may be aligned in the X-direction along a surface of the first rail 242, the array of features 250 of the second rail 244 may be aligned in the Y-direction along a surface of the second rail 244, the array of features 250 of the third rail 246 may be aligned in the Y-direction along a surface of the third rail 246, and the array of features 250 of the fourth rail 248 may be aligned in the X-direction along a surface of the fourth rail 248. In some embodiments, the features 250 may be arranged linearly. A gap between each feature may vary between features 250, or may be the same along the rails 242, 244, 246, 248.

In some embodiments, the features 250 of the rails 242, 244, 246, 248 may cover a portion of the top of the carrier 130. Another featureless portion 260 of the magnetic levitation elements 240 may not include the features 250. In other words, the featureless portion 260 of the top of the carrier may not include the features 250 and thus be positioned adjacent to a portion of the magnetic levitation elements 240 that includes the features 250. The featureless portion 260 may be substantially flat (e.g., a flat surface), and configured to enable the sensors 270 to measure and/or or detect a position of the carrier 130 during contactless levitation and/or transportation, as described above. In some embodiments, the sensors 270 may be positioned above the carrier 130 to measure and/or or detect a position of the carrier 130 during contactless levitation and/or transportation. The featureless portion 260 may be included on the top of one or more of the rails 242, 244, 246, 248 of the carrier 300A, and may be implemented as a featureless track that is aligned with the array of features 250. In some embodiments, the magnetic levitation elements 240 may each include an outer portion and an inner portion. In these embodiments, the features 250 may be located on one or more outer portions of the magnetic levitation elements 240 and the featureless portion 260 may be located on one or more inner portions of the magnetic levitation elements 240, as illustrated in FIG. 3A. In some embodiments, at least a portion of the base 310 may be featureless and may be substantially flat and configured to enable the sensors 270 to measure and/or or detect a position of the carrier 130 during contactless levitation and/or transportation (e.g., FIG. 3B). That is, at least a portion of the base 310 may function as the featureless portion 260.

During transportation, portions of the object 140 or the shutter disk 172 (e.g., the leading and trailing edges of the object 140 or the shutter disk 172) may be uncovered by the carrier 130, to assist in the enablement of the sensors 270 to sense the presence and/or position of the object 140 or the shutter disk 172. In addition, the exposed leading and trailing edges of the object 140 or the shutter disk 172 may enable the sensors 270 to determine the dimensions or identification of the object 140 or the shutter disk 172.

As briefly discussed above, the rails 242, 244, 246, 248 may be spaced apart from each other, as illustrated in FIG. 3A. In some cases, the first rail 242 may be spaced a distance in the Y-direction from the fourth rail 248. In some cases, the second rail 244 may be spaced a distance in the X-direction from the third rail 246. In some embodiments, the carrier 130 may have a substantially symmetric shape. That is, the distance from the end of the first rail 242 to the end of the fourth rail 248 may be substantially the same. For example, the carrier 300A may include the first rail 242 aligned in the X-direction, the second rail 244 aligned in the Y-direction, and the fourth rail 248 aligned in the X-direction, and the second rail 244 may have a center line extending in the Y-direction. In this example, a distance between first ends of the first rail 242 and the fourth rail 248 and the center line is substantially the same as a distance between second ends (e.g., the second ends being opposite to the first ends) of the first rail 242 and the fourth rail 248 and the center line. The stations 111-118 of the substrate processing system 100 may be configured to permit a symmetric carrier (e.g., carrier 300A) to remain in the processing station 205 during processing, without impacting processing in the processing station. For example, the processing station 205 may be large enough to accommodate the carrier 130 positioned on an end of the processing station 205 while the object 140 undergoes processing, such that the carrier 130 does not impact the processing.

In some embodiments, the carrier 300A may have an asymmetric shape. That is, the distance from the end of the first rail 242 to the end of the fourth rail 248 may be different. For example, the carrier 300A may include the first rail 242 aligned in the X-direction, the second rail 244 aligned in the Y-direction, and the fourth rail 248 aligned in the X-direction, and the second rail 244 may have a center line extending in the Y-direction. In this example, a distance between first ends of the first rail 242 and the fourth rail 248 and the center line is different than a distance between second ends (e.g., the second ends being opposite to the first ends) of the first rail 242 and the fourth rail 248 and the center line. When the carrier is asymmetric, the stations 111-118 of the substrate processing system 100 may be able to be smaller than when the carrier is symmetric, as an asymmetric carrier is able to more easily remain in the processing station 205 during processing without impacting the processing.

The base 310 of the carrier 300A may be formed from a non-magnetic material and vacuum compatible material, such as metal (e.g., aluminum (Al), non-magnetic stainless steel (e.g., 316 SST) or titanium (Ti)). In some embodiments, it is beneficial to select the material from which the carrier 300A is made to include a material that can also withstand high processing temperatures. In one example, the substrate carrier 300A is made from a ceramic material (e.g., alumina, quartz, zirconia, etc.). In some cases, the substrate carrier 300A may be coated with an electrically conductive coating to resolve any charge build-up issues in the substrate carrier 300A during processing within the process station 205. In some embodiments, the rails 242, 244, 246, 248 may include a magnetic material, and the base 310 may not include a magnetic material. By using a different material in the base 310 than the rails 242, 244, 246, 248, the carrier 300A may be configured to be lighter, and/or may be cheaper to manufacture.

The carrier 300A may be configured such that a center of gravity of the carrier 300A is within 5 millimeters (mm) of a geometric center of the carrier 300A, regardless of whether the carrier 300A is currently transporting an object 140. This helps to ensure the stability of the carrier 300A. In some embodiments, base 310 may include at least one at least one extending feature (e.g., extending features 312, 314), as illustrated in FIG. 3A. In some cases, the extending features 312, 314 may be configured to ensure that the center of gravity of the carrier 300A is within 5 millimeters (mm) of a geometric center of the carrier 300A, regardless of whether the carrier 300A is currently transporting the object 140 or the shutter disk 172. The extending features 312, 314 may include, or be made of, metal or ceramic.

The array of legs 320 (e.g., pegs) may be included in the carrier 300A and may be configured to support the carrier 300A. The legs 320 may be coupled to or disposed under the base 310 of the carrier 300A. The array of legs 320 may include any number of legs 320, such as an even number of legs 320. The legs 320 may be electrically coupled to one or more of the rails 242, 244, 246, 248, and may be configured to electrically ground the carrier 130. One or more of the rails 242, 244, 246, 248 may be positioned over the over the array of legs 320. In some embodiments, each rail 242, 244, 246, 248 may include at least four legs.

The carrier 300A may also include the opening 330 in the base 310. The opening may be configured to enable a sensor (e.g., sensors 270) to sense the presence and/or position of the object 140.

The support members 342, 344 of the carrier 300A may extend into a region below the carrier 300A (not shown). The support members 342, 344 may be configured to support the object 140 or the shutter disk 172. In some embodiments, the support members 342, 344 may be made of a ceramic or a material that is different from the material of the base 310. The support member 342 may form a gap (not shown) of 230 millimeters between the support member 342 and the support member 344, the gap configured to be small enough that the object 140 or shutter disk 172 may rest on a portion of the support members 342, 344. As illustrated in FIG. 3A, the object 140 or shutter disk 172 may be supported below the carrier 300A.

In some embodiments, the carrier 300A may include additional support members (not shown) configured to support more than one object. For example, the carrier 300A may be configured to carry two or more objects 140 simultaneously. In this example, the carrier 300A may include a third support member and a fourth support member both configured to support an object 140.

FIG. 3B illustrates an example carrier 300B that includes a magnetic levitation assembly (e.g., the magnetic levitation element 240 of FIGS. 2A and 2B), in accordance with embodiments of the present disclosure. In some embodiments, the carrier 130 described above may be implemented as the carrier 300B. The carrier 300B of FIG. 3B may be similar to the carrier 300A of FIG. 3A, and everything discussed herein with respect to the carrier 300A may also apply to the carrier 300B. However, in the carrier 300B, the base 310 and the magnetic levitation element 240 (including the rails 242, 244, 246, 248) each comprise magnetic material and are implemented together as one element. For example, the base 310 and rails 242, 244, 246, 248 may be implemented with the same ferromagnetic material. In these cases, the rails 242, 244, 246, 248 may be coupled to the support members 342, 344, the opening 330 may be in the rails 242, 244, 246, 248, and the extending features 312, 314 may be included in and a part of the rails 242, 244, 246, 248. Although FIG. 3B does not show the legs 320, the carrier 300B of these embodiments may include the legs 320 configured to support the carrier 300B.

Shutter Disk Station

Figure 4B:
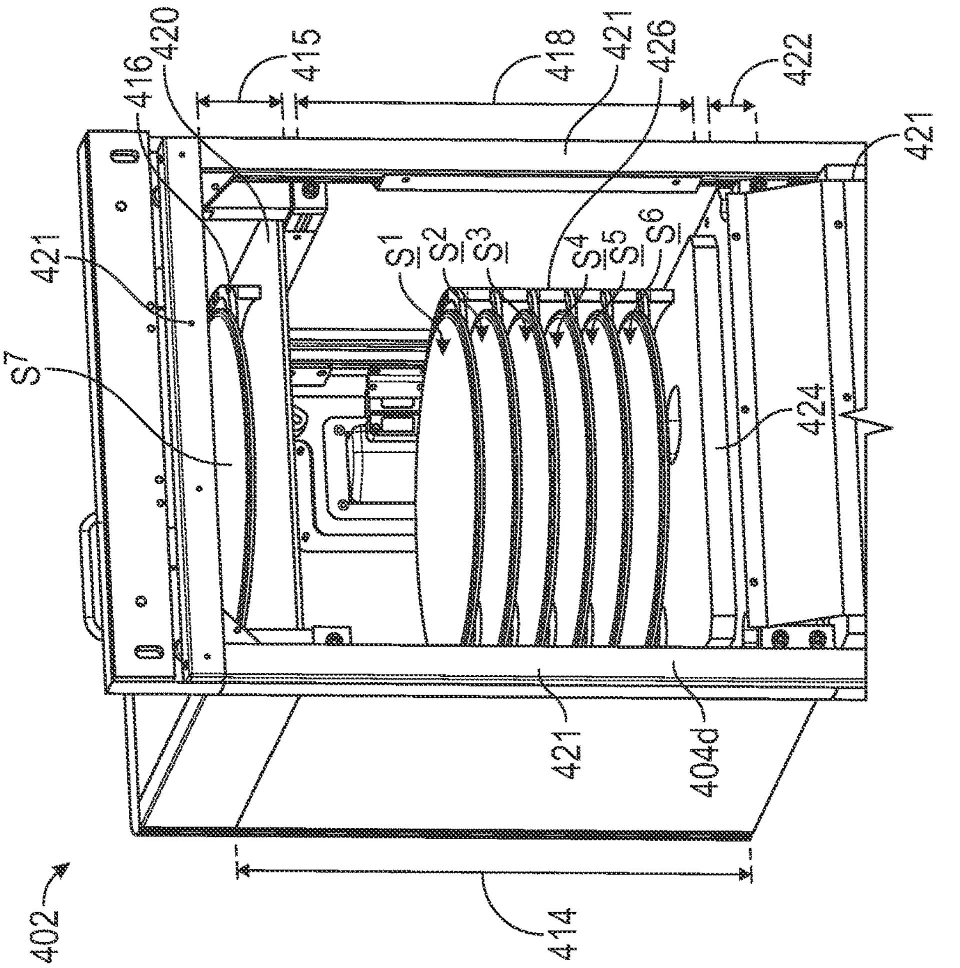
FIG. 4B illustrates a perspective view of a shutter disk system, in accordance with embodiments of the present disclosure
Figure 4A:
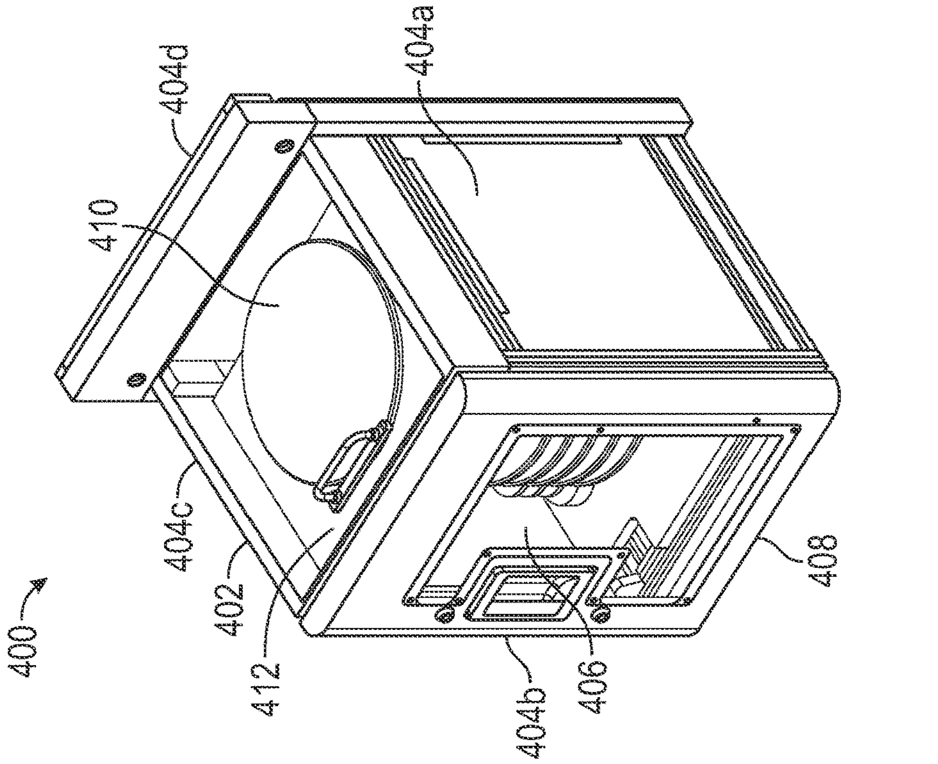
FIG. 4A illustrates a perspective view of a shutter disk system, in accordance with embodiments of the present disclosure.

Now referring to FIG. 4A a perspective view of a shutter disk system 400 is shown. The shutter disk system 400 can include the shutter disk system 170, as described above. The shutter disk system 400 includes a body 402. The body 402 may be formed from a vacuum compatible material, such as metal (e.g., aluminum (Al), stainless steel (e.g., 316 SST) or titanium (Ti)). In some embodiments, The body 402 may be formed from a material suitable for operation at pressures of about 760 Torr to about 780 Torr, e.g., about 760 Torr to about 770 Torr, about 765 Torr to about 775 Torr, or about 770 Torr to about 780 Torr, such as metal (e.g., aluminum (Al), stainless steel (e.g., 316 SST) or titanium (Ti)). In some embodiments, it is beneficial to select the material from which the substrate processing system 100 is made to ensure compatibility. The body 402 includes a plurality of faces 404*a-d*. For example a first face 404*a* may define a first side of the body 402. A second face 404*b* may be orthogonal to the first face and may define a second side of the body 402. A third face 404*c*, which may be parallel to the first face 404*a* and orthogonal to the second face 404*b*, may define a third side of the body, and a fourth face 404*d*, which may be parallel to the second face 404*b* and orthogonal to the third face 404*c* and first face 404*a*, may define a fourth side of the body. In an embodiment, the fourth face 404*d* may be the face and/or side of the body through which the contents within the body interfaces with a transfer region 124A within the factory interface 124.

A first door 406 is disposed on a face of the plurality of faces 404*a-d*. The first door 406 may be disposed on the second face 404*b*, which is parallel to and opposite to the fourth face 404*d*. The first door 406 may be disposed on the second face 404*b* to allow for opening and closing of the door without contacting one or more of the other faces or components of the body 402 and/or the substrate processing system 100. In an embodiment, the first door 406 is configured to open and/or close, which may expose an operational region of the interior volume of the body 402, which is described in further detail below, with reference to FIG. 4B. In an embodiment, the first door 406 may allow for the replacement of a storage rack 426 and/or shutter disks (e.g., disks $S^1$-$S^6$ and/or $S^7$) when the operational region is at atmospheric pressure, where the storage rack 426 is described in further detail below, with reference to FIG. 4C.

The body 402 includes a base 408. The base 408 may be composed of one or more of the same materials as the body 402. The base 408 may intersect the plurality of faces 404*a-d* at a lower end of the plurality of faces 404*a-d*. The body 402 includes a top 410. The top 410 may be parallel to the base 408, separated by the plurality of faces 404*a-d* of the body 402. The top 410 may intersect the plurality of faces 404*a-d* at an upper end of the plurality of faces 404*a-d*. In an embodiment, the top 410 includes a second door. A second door 412 is disposed on the top of the body 402. The second door 412 is configured to open and/or close, which may expose an interlock region of the interior volume of the body 402, in which the interlock region is described in further detail below, with reference to FIG. 4B.

Now referring to FIG. 4B, a perspective view through the fourth face 404*d* of a shutter disk system 400 is shown. The body 402 includes an interior volume 414. The interior volume 414 may include any suitable volume for holding one or more shutter disks. The interior volume 414 may include a pressure of about 1 mTorr to about 780 Torr, e.g., about 1 m Torr to about 1 Torr, about 1 Torr to about 100 Torr, about 100 Torr to about 300 Torr, about 300 Torr to about 400 Torr, about 400 Torr to about 500 Torr, about 500 Torr to about 600 Torr, about 600 Torr to about 700 Torr, or about 700 Torr to about 780 Torr. The interior volume 414 may be connected to one or more pumps, e.g., vacuum pumps, rotary pumps, ion pumps, or turbomolecular pumps, to maintain the pressure of about 1 m Torr to about 760 Torr. In an embodiment, the interior volume 414 may be at an atmospheric pressure, e.g., about 760 Torr to about 780 Torr. The interior volume 414 may be controlled so that the interior volume 414 includes one or more gas compositions that are different from the composition of the atmosphere surrounding the factory interface 124. In some configurations, the gas composition in the interior volume 414 includes one or more gases such as nitrogen, argon, helium, hydrogen, or the like. In some alternate configurations, the gas composition maintained in the interior volume 414 includes clean dry air (CDA).

The interior volume 414 includes an interlock region 415. The interlock region is a volume that is proximal to the second door 412, in which opening the second door 412 may provide access to the interlock region 415, as described above. The interlock region 415 may include a pressure of about 1 mTorr to about 70 Torr, e.g., about 1 m Torr to about 1 Torr, about 1 Torr to about 100 Torr, about 100 Torr to about 300 Torr, about 300 Torr to about 400 Torr, about 400 Torr to about 500 Torr, about 500 Torr to about 600 Torr, about 600 Torr to about 700 Torr, or about 700 Torr to about 780 Torr. In an embodiment, the interlock region 415 may be at an atmospheric pressure, e.g., about 760 Torr to about 780 Torr. The interlock region 415 may include a shutter disk holder 416. The shutter disk holder 416 may be configured to receive a shutter disk (e.g., disk $S^7$ in FIG. 4B) to be placed into the shutter disk system 400.

The interlock region 415 may be adjacent to an operational region 418, where the interlock region 415 is separated from the operational region 418 by an isolator plate 420. The isolator plate 420 may be formed from a vacuum compatible material, such as metal (e.g., aluminum (Al), non-magnetic stainless steel (e.g., 316 SST) or titanium (Ti)). In an embodiment, the isolator plate 420 may be vacuum compatible material to allow for a pressure differential between the interlock region 415 and the operational region 418.

The operational region 418 may be located below the isolator plate 420, where the operational region 418 may be configured at a pressure of about 1 mTorr to about 780 Torr, e.g., about 1 m Torr to about 1 Torr, about 1 Torr to about 100 Torr, about 100 Torr to about 300 Torr, about 300 Torr to about 400 Torr, about 400 Torr to about 500 Torr, about 500 Torr to about 600 Torr, about 600 Torr to about 700 Torr, or about 700 Torr to about 780 Torr. In an embodiment, the operational region 418 may be at an atmospheric pressure, e.g., about 760 Torr to about 780 Torr. In an embodiment, the operational region 418 and the interlock region 415 may have different pressures. For example, the operational region 418 may have a first pressure of about 1 m Torr to about 780 Torr, e.g., about 1 m Torr to about 1 Torr, about 1 Torr to about 100 Torr, about 100 Torr to about 300 Torr, about 300 Torr to about 400 Torr, about 400 Torr to about 500 Torr, about 500 Torr to about 600 Torr, or about 600 Torr to about 780 Torr, while the interlock region 415 may have a different pressure of about 700 Torr to about 780 Torr, e.g., about 700 Torr to about 720 Torr, about 720 Torr to about 740 Torr, about 740 Torr to about 760 Torr, or about 760 Torr to about 780 Torr. Without being bound by theory, the isolator plate 420 may allow for a shutter disk to be placed in the interlock region 415 of the shutter disk system 400 without increasing the pressure of the operational region 418 and/or the substrate processing system 100. By not increasing the pressure and/or breaking vacuum of the operational region 418, the substrate processing system 100 may continue to perform operations during routine maintenance of one or more shutter disks, reducing costs and reducing the need to break vacuum that would require a subsequent pumping down session.

In an embodiment, the operational region 418 and the interlock region 415 may have the same pressures. For example, the operational region 418 and the interlock region 415 may have the same pressure of about 1 mTorr to about 780 Torr, e.g., about 1 m Torr to about 1 Torr, about 1 Torr to about 100 Torr, about 100 Torr to about 300 Torr, about 300 Torr to about 400 Torr, about 400 Torr to about 500 Torr, about 500 Torr to about 600 Torr, about 600 Torr to about 700 Torr, or about 700 Torr to about 780 Torr. In an embodiment, the operational region 418 and the interlock region 415 may have the same pressure after the interlock region 415 is pumped down by a vacuum pump. Without being bound by theory, an interlock region 415 that is the same pressure as the operational region 418, such as atmospheric pressure, may allow the handler (not shown) to transfer the shutter disk placed in the shutter disk holder 416 of the interlock region 415 to the operational region 418 such that the shutter disk may then be processed in the substrate processing system 100.

In an embodiment, the interior volume 414 may include a cooling system 422. The cooling system 422 may maintain a temperature of the operational region 418 to about 20° C. to about 80° C., e.g., about 20° C. to about 40° C., about 40° C. to about 60° C., or about 60° C. to about 80° C. In an embodiment, the cooling system may include a purge gas system (not shown). The purge gas system (not shown) may cool the operational region 418 by injecting one or more inert gases, e.g., nitrogen, helium, hydrogen, or argon, into the operational region 418. In an embodiment, the purge gas system (not shown) may cool the operational region 418 by about 0.1° C. to about 80° C., e.g., about 0.1° C. to about 20° C., about 20° C. to about 40° C., about 40° C. to about 60° C., or about 60° C. to about 80° C. In an embodiment the cooling system 422 may include a cooling plate 424. The cooling plate 424 may include a metallic plate having a circulating fluid inside, e.g., water, nitrogen, glycol, or the like. In some embodiments, the cooling system includes a fluid temperature controlled heat exchanging device disposed on at least one of the plurality of faces, a base, and a top of the body 402. The cooling plate 424 may reduce the temperature of the operational region 418 by sequestering heat from the operational region 418. In an embodiment, the cooling plate 424 may cool the operational region 418 by about 0.1° C. to about 80° C., e.g., about 0.1° C. to about 20° C., about 20° C. to about 40° C., about 40° C. to about 60° C., or about 60° C. to about 80° C.

In an embodiment, the interior volume 414 may include a heating system (not shown). The heating system may include a radiative heater source or a resistive heater source. For example, a radiative heater source may include a resistive heating element or lamps that is configured to run at a desired processing temperature. As a further example, a resistive heater source may include a resistive heating element that is configured to conduct heat to one or more walls of the shutter disk system 400. In an embodiment, the heating system may heat the operational region 418 to a temperature of about 80° C. to about 300° C., e.g., about 80° C. to about 100° C., about 100° C. to about 150° C., about 150° C. to about 200° C., about 200° C. to about 250° C., or about 250° C. to about 300° C. The heating system may increase the temperature of the operational region 418 by about 0.1° C. to about 300° C., e.g., about 0.1° C. to about 50° C., about 50° C. to about 100° C., about 100° C. to about 150° C., about 150° C. to about 200° C., about 200° C. to about 250° C., or about 250° C. to about 300° C.

In an embodiment, the interior volume 414 may include one or more sensors (not shown). The sensors may include a temperature sensor and/or a metrology sensor. The temperature sensor may include any suitable temperature sensor for monitoring the temperature of the interior volume, e.g., non-contact optical temperature sensor. The metrology sensor may include any suitable sensor for inspecting the shutter disk and/or imaging the shutter disk, e.g., an imaging sensor (e.g., camera) and/or automated inspection sensor. A metrology sensor can include, but is not limited to, a system for measuring the physical attributes of a shutter disk (e.g., shutter disk distortion or curvature measurement system) and a system for measuring attributes of the thin film layers formed on a surface of the shutter disk, such as a particle measure detection system, a deposited film composition measurement system, a deposited film thickness measurement system, a deposited film Rs measurement system, or other useful deposited film property measurement systems. Without being bound by theory, the one or more sensors (not shown) may allow for monitoring the performance of the shutter disk system and may improve the life of the shutter disk or when the shutter disk needs to be refurbished by identifying one or more properties of the shutter disk. In one example, the one or more properties of the shutter disk can include the relative distortion of the shutter disk, the amount of deposition formed on the shutter disk (e.g., deposited layer thickness), number of particles positioned on a surface of the shutter disk, positioning of the shutter disk within system, properties of the films deposited on the shutter disk, and other useful metrics.

Figure 4C:
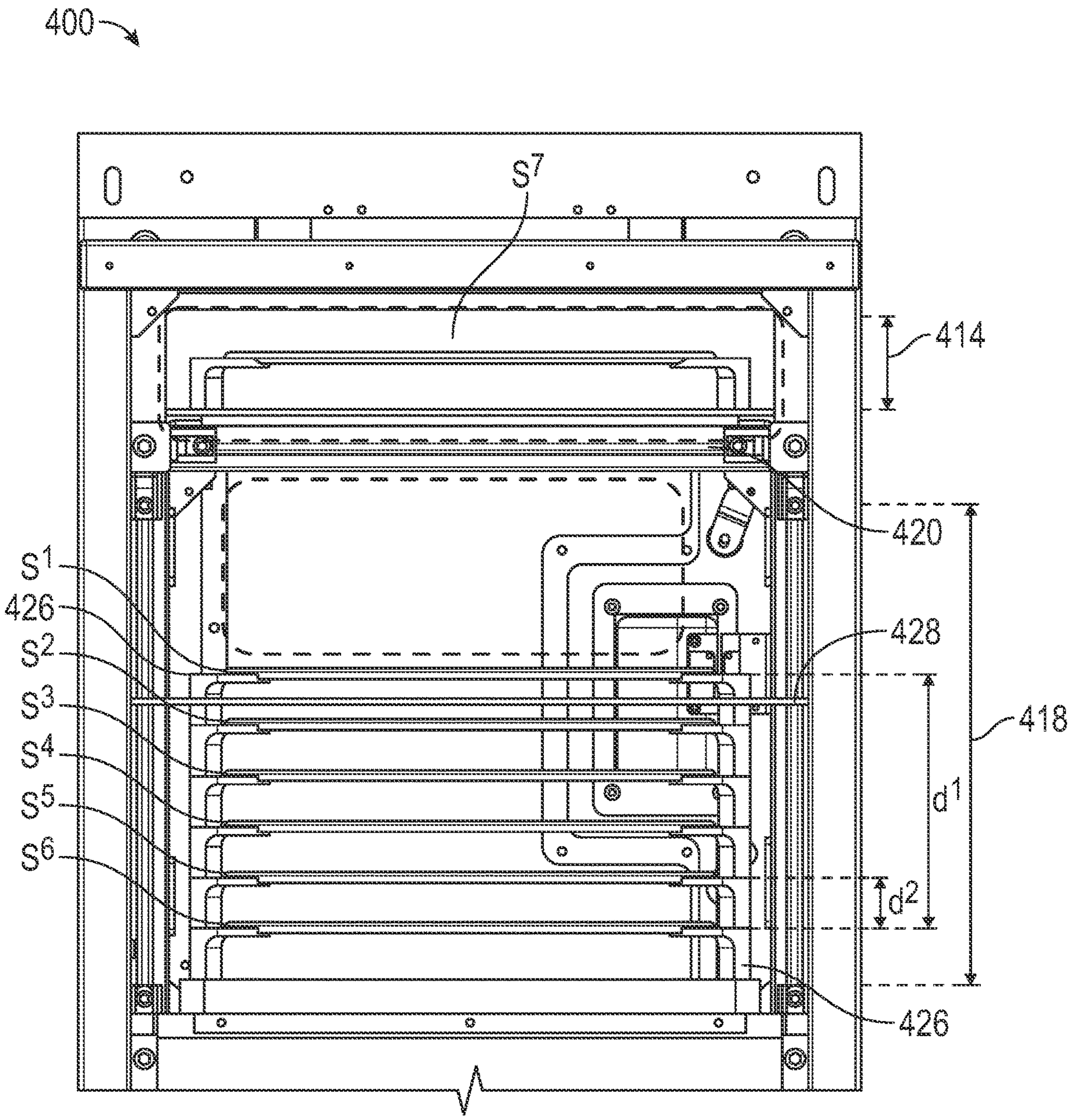
FIG. 4C illustrates a cross-sectional view of a shutter disk system, in accordance with embodiments of the present disclosure.

Now referring to FIG. 4C, a cross-sectional view of a shutter disk system is shown. The shutter disk system 400 includes a storage rack 426. The storage rack 426 may include a rack capable of storing about 2 to about 10 shutter disks, e.g., about 2 to about 4, about 4 to about 6, about 6 to about 8, or about 8 to about 10. For example, the storage rack 426 may be configured to store a first shutter disk $S^1$, a second shutter disk $S^2$, a third shutter disk $S^3$, a fourth shutter disk $S^4$, a fifth shutter disk $S^5$, and a sixth shutter disk $S^6$. In an embodiment, the first shutter $S^1$, second shutter disk $S^2$, third shutter disk $S^3$, fourth shutter disk $S^4$, fifth shutter disk $S^5$, a sixth shutter disk S may independently be copper, tantalum nitride, titanium, barium, cerium, platinum, gold, silver, or other transition metal suitable for use as a shutter disk. For example, $S^1$ and $S^4$ may each be copper, $S^2$ and $S^5$ may each be tantalum nitride, and $S^3$ and $S^6$ may each be titanium. As a further example, each of $S^1$, $S^2$, and $S^3$ may be copper, and each of $S^4$, $S^5$, and $S^6$ may be tantalum nitride.

In an embodiment, the storage rack 426 includes first vertical side and a second vertical side. The first vertical side and the second vertical side include a height "$d^1$", which may be about 120 cm to about 180 cm, e.g., about 120 cm to about 140 cm, about 140 cm to about 160 cm, or about 160 cm to about 180 cm. The first vertical side includes a plurality of horizontal tabs extending centrally toward the operational region 418, and the second vertical side includes a plurality of horizontal tabs extending centrally toward the operational region 418. The plurality of horizontal tabs of the first vertical side and the second vertical side may be complementary and/or parallel, such that a first vertical side horizontal tab and a second vertical side horizontal tab are at the same height creating rack locations for storing individual shutter disks. The rack locations may have a vertical slot spacing distance "$d^2$" of about 20 cm to about 50 cm, e.g., about 20 cm to about 30 cm, about 25 cm to about 45 cm, or about 30 cm to about 50 cm.

In an embodiment, the rack locations may be identified by a rack identifier (not shown) that is shown on a portion of the storage rack 426 and/or the rack identifier information may be stored in a memory of a controller 101. A rack identifier may indicate the composition of the shutter disk that is being stored in the rack location. The rack identifier may include a barcode, QR code, pincode, color code, or the like. For example, a rack identifier may include a barcode indicating that the rack location is for a copper shutter disk. As a further example, a rack identifier may include a QR code indicating that the rack location is for a tantalum nitride shutter disk. The controller 101 can use the rack identifier information to control the positioning and movement of a shutter disk within the substrate processing system 100 by use of a carrier 130 and/or multi-axis transfer robot (e.g., actuator 502 (FIG. 5)) positioned in the factory interface 124.

In an embodiment, a rack identifier may indicate the location of the shutter disk to be stored in the storage rack 426. For example, a shutter disk may be disposed in the interlock region 414 at atmospheric pressure using the second door 412. A vacuum may be applied to the interlock region 415 using one or more vacuum pumps. The vacuum may be applied until the interlock region 415 and the operational region 418 are at the same pressure, in which the handler (not shown) may transfer the shutter disk to the storage rack 426 according to the rack identifier. The handler may then identify and transmit the shutter disk to the substrate processing system 100 and carrier 130 according to the rack identifier.

In an embodiment, the storage rack 426 may include a rack isolator 428. The rack isolator may be formed from a metal (e.g., aluminum (Al), non-magnetic stainless steel (e.g., 316 SST) or titanium (Ti)). In an embodiment, the rack isolator 428 may be configured to separate the one or more shutter disks, e.g., $S^0$, $S^1$, $S^2$, $S^3$, $S^4$, $S^5$, $S^6$, $S^7$ . . . $S_x$, stored in a first rack location within the storage rack 426 from contaminating an alternate shutter disk in an alternate or adjacent rack location. Without being bound by theory, by preventing contamination of a shutter disk the shutter disk may require less maintenance.

Figure 5:
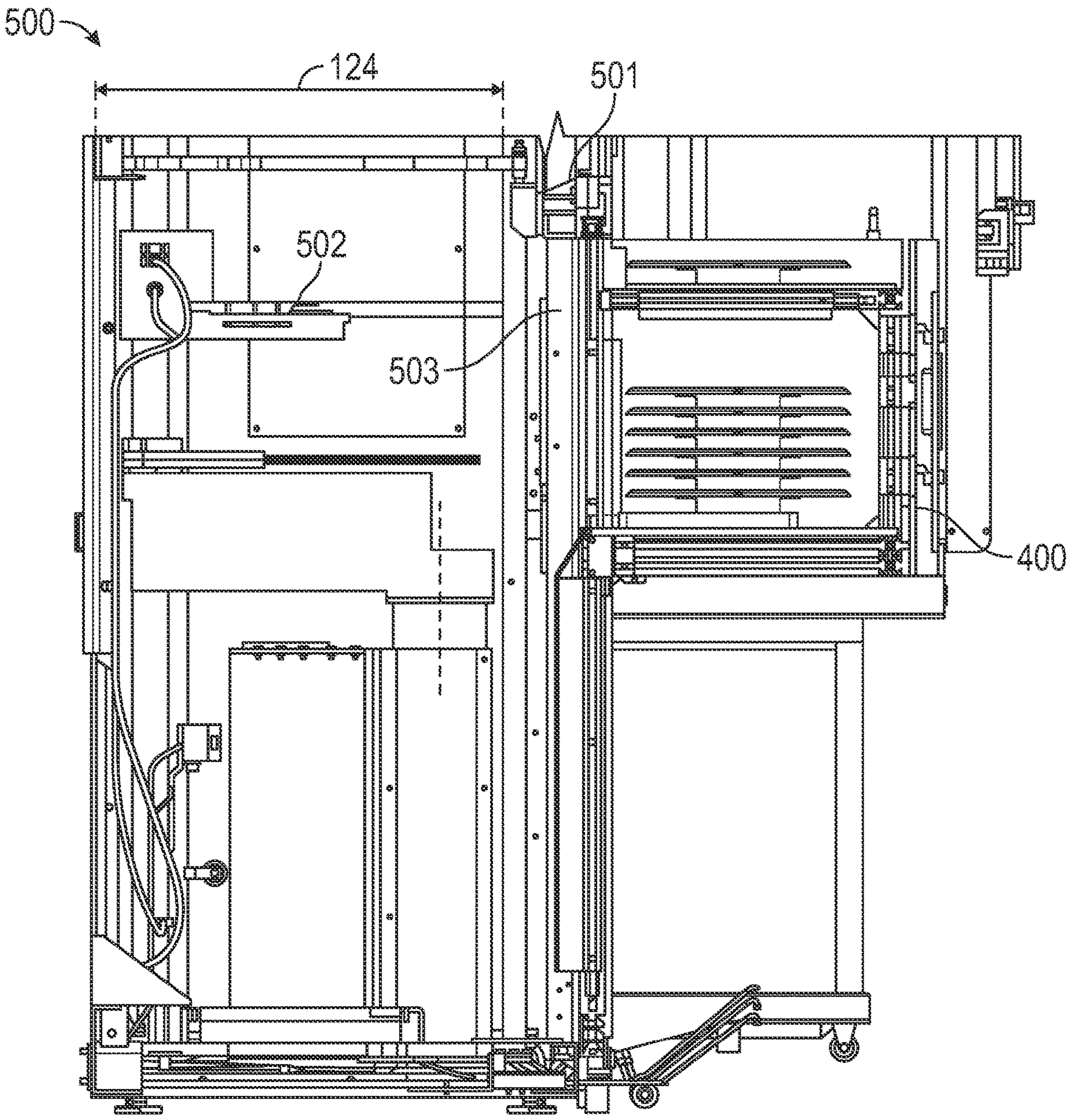
FIG. 5 illustrates a cross-sectional view of a substrate processing system having a shutter disk system, in accordance with embodiments of the present disclosure.

Now referring to FIG. 5, which is a side cross-sectional view of a substrate processing system 500, which includes the factory interface 124 and a shutter disk system 400. The substrate processing system 500 includes an actuator 501 disposed within the factory interface 124 and configured to interface with the shutter disk system 400. In an embodiment, the actuator 501 includes a door 503 that is configured to interface with and seal against a sealing portion of the fourth face 404*d*. The sealing portion includes a sealing surface 421 (FIG. 4B) that is configured to interface with a sealing element (e.g., O-ring) disposed within a portion of the sealing surface 421 or within the door 503 of the actuator 501. In operation, when the actuator 501 has positioned the door 503 in an open position, in which where the actuator is open, the handler may retrieve a shutter disk from the shutter disk station 400. Alternatively, when the door 503 of the actuator 501 may be closed, the handler may be prevented from retrieving a shutter disk from the shutter disk system 400 and the environment within the shutter disk station 400 is sealed off from the region 124A of the factory interface 124. In an embodiment, the actuator 501 may be open when the pressures of the factory interface 124 and the shutter disk system 400 are the same. In an embodiment, the actuator 501 may be closed when the pressures of the factory interface 124 and the shutter disk system are different.

Processing Sequence Example

Figure 6:
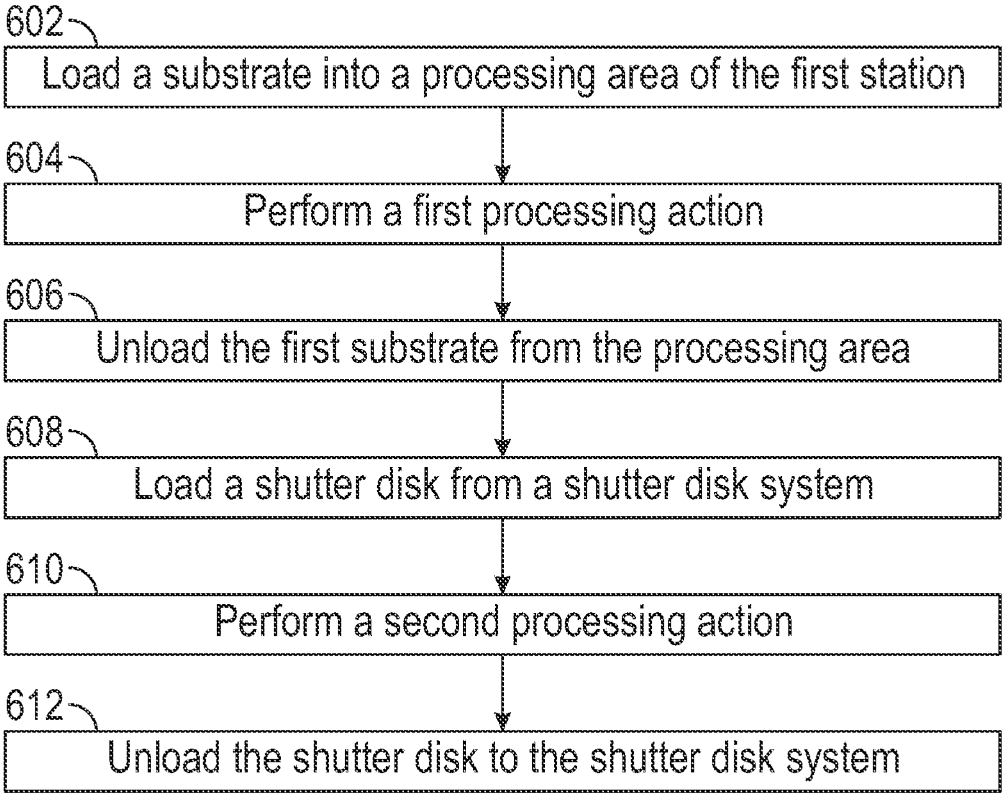
FIG. 6 illustrates a method workflow of processing a substrate, in accordance with embodiments of the present disclosure.

FIG. 6 is a flow diagram of a method 600 of processing a substrate in a substrate processing system according to one embodiment. Method 600 may be best understood with reference to FIGS. 7A and 7B. While the operations of method 600 are described in a linear manner in the flow diagram shown in FIG. 6. As implemented, the operations of method 600 may occur simultaneously, may overlap in time, and may be repeated individually, or as a whole. Further, while only two substrates, substrate A and substrate B, and two shutter disks $S^0$ and $S^1$, are focused on in this example of method 600 illustrated in FIGS. 7A and 7B, as implemented, a plurality of substrates or shutter disks will be simultaneously moving one-after-another through the substrate processing system 700 at any given time.

Figure 7B:
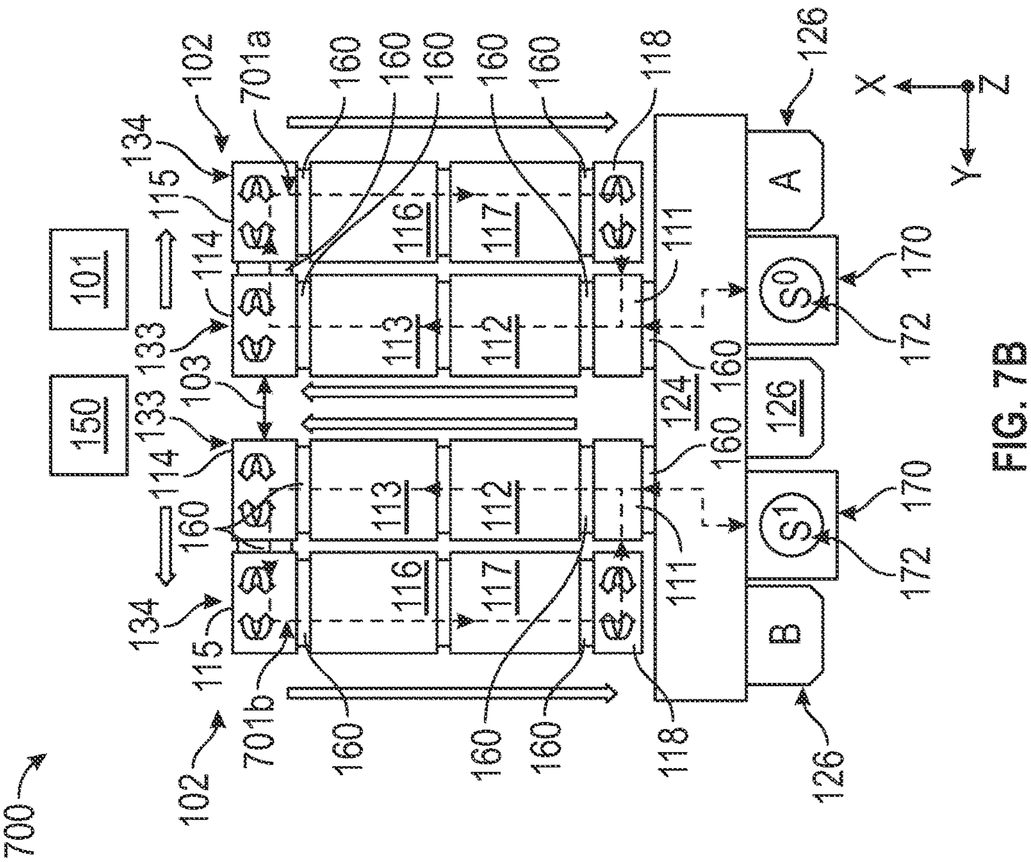
FIGS. 7A and 7B illustrates top schematic views of an example substrate processing system having a first processing line and a second processing line, in which embodiments of the present disclosure may be implemented.
Figure 7A:
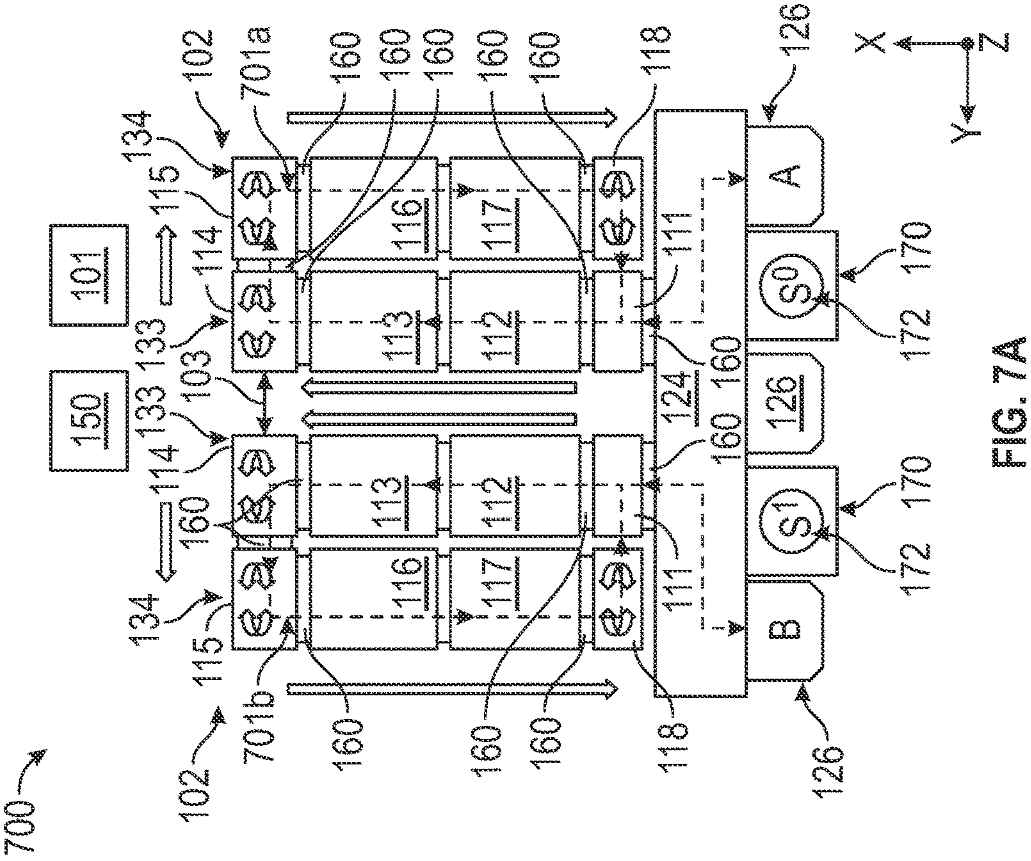

FIG. 7A is a schematic view of a substrate processing system 700 according to one embodiment of method 600. The substrate processing system 700 includes the processing stations 111-118, as described above. At operation 602, a substrate "A", initially having been received by an actuator (not shown), such as the actuator 502, from a front opening unified pod (FOUP) 126 of the factory interface 124, has, as indicated by the processing line 701*a*, e.g., "dot path", is transited to a carrier 130 in the first station 111 by the handler. Substrate A is then sequentially transferred from the first station 111 to the second station 112, the third station 113, and the fourth station 114, before being conveyed through the fifth station 115, conveyed through the sixth station 116, and then being positioned within the seventh station 117 of the first processing line 701*a*.

At operation 604, a first processing action is performed on the substrate "A". The first processing action is performed in the seventh station 117 of the first processing line 701*a*. The first processing action may include a deposition action and/or an etching action. For example, the first processing action may include a tantalum nitride deposition, a copper deposition, or any deposition that deposits at least one layer on the substrate. Alternatively, the first processing action may include an etching action performed by an etching station. In an embodiment, the seventh station 117 of the first processing line 701*a* may utilize PVD, CVD, ALD, or other suitable process to perform the first processing action as required in the first processing line 701*a*.

During the sequential transferring process, one or more processing steps (e.g., non-deposition processes) may be performed on a substrate (e.g., substrates $A_1$, $A_2$, $A_3$, $A_4$, $A_5$, . . . , $A_N$) within each of the second station 112, the third station 113, and the fourth station 114, before being conveyed through the fifth station 115 and is currently positioned in the sixth station 116 of first processing line 701*a*.

Similarly, a second substrate "B", initially having been received from a FOUP 126 of the factory interface 124, as indicated by the "dot path", before being conveyed through the first section station 111 and then being positioned within the sixth station 116 of a first processing line 701*b*.

During the sequential transferring process one or more processing steps (e.g., non-deposition processes) may be performed on a substrate (i.e., substrates $B_1$, $B_2$, $B_3$, $B_4$, . . . , $B_N$) within each of the second station 112, the third station 113, and the fourth station 114, before being conveyed through the fifth station 115 and then being positioned in the sixth station 116, and then being positioned within the seventh station 117 of the first processing line 701*b*.

When the substrate "B" is positioned within the seventh station 117, the first processing action is performed on the substrate "B". The first processing action is performed in the seventh station 117 of the first processing line 701*b*. The first processing action may include any first processing action as described above, with referenced to first processing line 701*a*. For example, the first processing action may include a tantalum nitride deposition, a copper deposition, or any deposition that deposits at least one layer on the substrate. Alternatively, the first processing action may include an etching action performed by an etching station. In an embodiment, the seventh station 117 of the first processing line 701*a* may utilize PVD, CVD, ALD, or other suitable process to perform the first processing action as required in the first processing line 701*b*. In an embodiment, processing line 701*a* and 701*b* may be different processing actions. As noted above the operations of method 600 may occur simultaneously, may overlap in time, and may be repeated individually, or as a whole, as required.

During the sequential transferring process of the substrate A or substrate B to the seventh station 117, other substrates are sequentially transferred in the first processing line 701*a* or first processing line 701*b*. For example, substrate A sequentially transfers to the eighth station 118. Substrate $A_1$ sequentially transfers to the seventh station 117. Substrate $A_2$ sequentially transfers to the sixth station 116. Substrate $A_3$ sequentially transfers to the fifth station 115. Substrate $A_4$ sequentially transfers to the fourth station 114. Substrate $A_5$ sequentially transfers to the third station 113. Substrate $A_6$ enters the first processing line 701*a* and sequentially transfers to the second station 112, and a substrate $A_x$ leaves the first processing line 701*a*. As a further example, substrate B sequentially transfers to the eighth station 118. Substrate $B_1$ sequentially transfers to the seventh station 117. Substrate $B_2$ sequentially transfers to the sixth station 116. Substrate $B_3$ sequentially transfers to the fifth station 115. Substrate $B_4$ sequentially transfers to the fourth station 114. Substrate $B_5$ sequentially transfers to the third station 113. Substrate $B_6$ enters the first processing line 701*b* and sequentially transfers to the second station 112, and a substrate $B_x$ leaves the first processing line 701*b*.

Additionally during the sequential transferring process of the plurality of substrates of the first processing line 701*a* and the first processing line 701*b*, shown in FIG. 8B, occur at approximately the same time.

At operation 606, the processed substrate A is unloaded from the carrier 130 in the first station 111 and removed from the processing area by transmitting the substrate to the handler (not shown), such as the actuator 502. The FOUP 126 that originated the substrate A then receives the processed substrate A from the handler as indicated by the processing line 701*a*, e.g., "dot path". Concurrently, and/or sequentially, the processed substrate B is unloaded from the carrier 130 in the first station 111 and removed from the processing area by transmitting the substrate to the handler (not shown). The FOUP 126 that originated the substrate B then receives the processed substrate B from the handler as indicated by the first processing line 701*b*, e.g., "dot path".

At operation 608, a shutter disk "$S^O$", initially having been received by a handler (not shown) from a shutter disk system 170 of the factory interface 124 as indicated by the second processing line 702*a*, e.g., "dot path", is transited to a carrier 130 in the first station 111 by the handler and by commands from the controller 101. In an embodiment, the shutter disk $S^O$ may be selected by the controller 101 based on a composition of the shutter disk and/or one or more rack identifiers. A rack identifier may indicate the composition of the shutter disk and/or the specific processing action suitable for the shutter disk. For example, the rack identifier may indicate that the shutter disk is composed of tantalum nitride, where the processing action to be performed is a tantalum deposition. Shutter disk $S^O$ is then sequentially transferred from the first station 111 to the second station 112, the third station 113, and the fourth station 114, before being conveyed through the fifth station 115, conveyed through the sixth station 116, and then being positioned within the seventh station 117 of the first processing line 701*a*.

At operation 610, a second processing action is performed on the shutter disk $S^O$. The second processing action is performed in the seventh station 117 of the second processing line 702*a*. The second processing action may include a deposition action and/or an etching action. In an embodiment, the second processing action may be different than the first processing action. In an embodiment, the second processing action maybe the same as the first processing action. For example, the second processing action may be different than the first processing action, so as to prime the substrate processing system to perform a different deposition, e.g., transition from a copper deposition to a tantalum nitride deposition. For example, the second processing action may include a tantalum nitride deposition, a copper deposition, or any deposition that deposits at least one layer on the substrate. Alternatively, the second processing action may include an etching action performed by an etching station. In an embodiment, the seventh station 117 of the second processing line 702*a* may utilize PVD, CVD, ALD, or other suitable process to perform the second processing action as required in the second processing line 702*a*.

During the sequential transferring process, one or more processing steps (e.g., non-deposition processes) may be performed on the shutter disk $S^O$ within each of the second station 112, the third station 113, and the fourth station 114, before being conveyed through the fifth station 115 and is currently positioned in the sixth station 116 of second processing line 702*a*.

Similarly, a second shutter disk "$S^1$", initially having been received by a handler (not shown) from a shutter disk system 170 of the factory interface 124 as indicated by the second processing line 702*b*, e.g., "dot path", is transited to a carrier 130 in the first station 111 by the handler. In an embodiment, the shutter disk $S^1$ may be selected by the controller 101 based on a composition of the shutter disk and/or one or more rack identifiers. The rack identifier may indicate the composition of the shutter disk and/or the specific processing action suitable for the shutter disk. For example, the rack identifier may indicate that the shutter disk is composed of tantalum nitride, where the processing action to be performed is a tantalum deposition. Shutter disk $S^1$ is then sequentially transferred from the first station 111 to the second station 112, the third station 113, and the fourth station 114, before being conveyed through the fifth station 115, conveyed through the sixth station 116, and then being positioned within the seventh station 117 of the second processing line 702*b*.

During the sequential transferring process one or more processing steps (e.g., non-deposition processes) may be performed on the shutter disk $S^1$ within each of the second station 112, the third station 113, and the fourth station 114, before being conveyed through the fifth station 115 and then being positioned in the sixth station 116, and then being positioned within the seventh station 117 of the second processing line 702*b*.

When the shutter disk "$S^1$" is positioned within the seventh station 117, the second processing action is performed on the shutter disk "$S^1$". The second processing action is performed in the seventh station 117 of the second processing line 702*b*. The second processing action may include any second processing action as described above, with referenced to second processing line 702*a*. In an embodiment, the second processing action may be different than the first processing action. In an embodiment, the second processing action maybe the same as the first processing action. For example, the second processing action may be different than the first processing action, so as to prime the substrate processing system to perform a different deposition, e.g., transition from a copper deposition to a tantalum nitride deposition. For example, the second processing action may include a tantalum nitride deposition, a copper deposition, or any deposition that deposits at least one layer on the substrate. Alternatively, the second processing action may include an etching action performed by an etching station. In an embodiment, the seventh station 117 of the second processing line 702*b* may utilize PVD, CVD, ALD, or other suitable process to perform the first processing action as required in the first processing line 702*b*. In an embodiment, processing line 702*a* and 702*b* may be different processing actions. As noted above the operations of method 600 may occur simultaneously, may overlap in time, and may be repeated individually, or as a whole, as required.

During the sequential transferring process of the shutter disk $S^0$ or shutter disk $S^1$ to the seventh station 117, other substrates or shutter disks may be sequentially transferred in the second processing line 702*a* or second processing line 702*b*. For example, shutter disk $S^0$ sequentially transfers to the eighth station 118. Substrate $A_1$ or shutter disk $S^2$ sequentially transfers to the seventh station 117. Substrate $A_2$ or shutter disk $S^3$ sequentially transfers to the sixth station 116. Substrate $A_3$ or shutter disk $S^4$ sequentially transfers to the fifth station 115. Substrate $A_4$ or shutter disk $S^5$ sequentially transfers to the fourth station 114. Substrate $A_5$ or shutter disk $S^6$ sequentially transfers to the third station 113. Substrate $A_6$ or shutter disk $S^7$ enters the second processing line 702*a* and sequentially transfers to the second station 112, and $B_x$ or shutter disk $S^x$ leaves the second processing line 702*a*. As a further example, shutter disk $S^1$ sequentially transfers to the eighth station 118. Substrate $B_1$ or shutter disk $S^2$ sequentially transfers to the seventh station 117. Substrate $B_2$ or shutter disk $S^3$ sequentially transfers to the sixth station 116. Substrate $B_3$ or shutter disk $S^4$ sequentially transfers to the fifth station 115. Substrate $B_4$ or shutter disk $S^5$ sequentially transfers to the fourth station 114. Substrate $B_5$ or shutter disk $S^6$ sequentially transfers to the third station 113. Substrate $B_6$ or shutter disk $S^7$ enters the second processing line 702*b* and sequentially transfers to the second station 112, and a substrate $B_x$ or Shutter disk $S^x$ leaves the second processing line 702*b*.

Additionally during the sequential transferring process of the plurality of substrates of the second processing line 702*a* and the second processing line 702*b*, shown in FIG. 7B, occur at approximately the same time.

At operation 612, the shutter disk $S^0$ is unloaded from the carrier 130 in the first station 111 and removed from the processing area by transmitting the shutter disk to the handler (not shown), such as the actuator 502. The shutter disk system 170 that originated the shutter disk $S^0$ then receives the processed shutter disk $S^0$ from the handler as indicated by the processing line 702*a*, e.g., "dot path". Concurrently, and/or sequentially, the processed shutter disk $S^1$ is unloaded from the carrier 130 in the first station 111 and removed from the processing area by transmitting the shutter disk to the handler (not shown). The shutter disk system 170 that originated the shutter disk $S^1$ then receives the processed shutter disk $S^1$ from the handler as indicated by the processing line 702*b* (e.g., "dotted path").

As noted above the operations of method 600 may occur simultaneously, may overlap in time, and may be repeated individually, or as a whole, as required as the plurality of substrates (e.g., substrates A, $A_1$, $A_2$, . . . , $A_N$, and B, $B_1$, $B_2$, . . . , $B_N$, and X) and/or the plurality of shutter disks (e.g., shutter disks $S^0$, $S^1$, $S^2$, $S^3$, . . . , and $S^x$), and simultaneously move one-after-another through the substrate processing system 800 at any given time.

Overall, the substrate transfer system of the present disclosure allows for routine maintenance to be performed on one or more shutter disks without the need to break vacuum or extend the length of pump down sessions, reducing costs and system down time. The shutter disk system allows for routine maintenance and switching of shutter disks without the need to break vacuum. The shutter disk system can be utilized to enable a plurality of deposition processes to be performed within the system (e.g., cluster tool) before the vacuum portions of the system will need to be maintained.

Additional Considerations

In the above description, details are set forth by way of example to facilitate an understanding of the disclosed subject matter. It should be apparent to a person of ordinary skill in the field, however, that the disclosed implementations are exemplary and not exhaustive of all possible implementations. Thus, it should be understood that reference to the described examples is not intended to limit the scope of the disclosure. Any alterations and further modifications to the described devices, instruments, methods, and any further application of the principles of the present disclosure are fully contemplated as would normally occur to one skilled in the art to which the disclosure relates. In particular, it is fully contemplated that the features, components, and/or steps described with respect to one implementation may be combined with the features, components, and/or steps described with respect to other implementations of the present disclosure. As used herein, the term "about" may refer to a +/−10% variation from the nominal value. It is to be understood that such a variation can be included in any value provided herein.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

While the foregoing is directed to embodiments of the present disclosure, other and further embodiments of the disclosure may be devised without departing from the basic scope thereof, and the scope thereof is determined by the claims that follow.

What is claimed is:

1. A shutter disk system, comprising:
- a body comprising a plurality of faces, a base, and a top, wherein the body comprises:
- an interior volume, wherein the interior volume comprises:
  - an interlock region configured to receive at least one shutter disk, and
  - an operational region adjacent to the interlock region, the operational region separate from the interlock region by an isolator plate;
  - a shutter disk stack disposed in the operational region, wherein the shutter disk stack comprises at least a storage rack configured to receive two or more shutter disks;
- a first door disposed on a face of the plurality of faces proximal to the operational region;
- a second door disposed proximal to the interlock region; and
- a third door disposed proximal to a portion of the interlock region and a portion of the operational region.

2. The shutter disk system of claim 1, wherein the operational region and the interlock region comprise different pressures.

3. The shutter disk system of claim 1, wherein the operational region and the interlock region comprise equal pressures.

4. The shutter disk system of claim 1, further comprising a cooling system comprising a heat exchanging device disposed on at least one of the plurality of faces, a base, and a top.

5. The shutter disk system of claim 4, wherein the cooling system comprises a purge gas system or a cooling plate.

6. The shutter disk system of claim 1, further comprising a radiative heater source or a resistive heater source.

7. The shutter disk system of claim 1, wherein the shutter disk stack comprises a rack identifier.

8. The shutter disk system of claim 1, the operational region comprises a pressure of about 1 Torr to about 780 Torr and the interlock region comprises a pressure of about 1 Torr to about 780 Torr.

9. The shutter disk system of claim 1, wherein the interior volume comprises one or more sensors.

10. The shutter disk system of claim 9, wherein the one or more sensors comprises a temperature sensor or a metrology sensor.

11. A substrate processing system, comprising:
- two or more process stations;
- a factory interface coupled to the two or more process stations; and
- a shutter disk system coupled to the factory interface, wherein the factory interface is disposed between the two or more process stations and the shutter disk system, and the shutter disk system comprises:
  - a body comprising a plurality of faces, a base, and a top, wherein the body comprises:
    - an interior volume, wherein the interior volume comprises:
      - an interlock region configured to receive at least one shutter disk, and
      - an operational region adjacent to the interlock region, the operational region separate from the interlock region by an isolator plate;
      - a shutter disk stack disposed in the operational region, wherein the shutter disk stack comprises at least a storage rack configured to receive at least two or more shutter disks;
  - a first door disposed on a face of the plurality of faces proximal to the operational region;
  - a second door disposed on the top proximal to the interlock region; and
  - a third door disposed proximal to a portion of the interlock region and a portion of the operational region.

12. The substrate processing system of claim 11, wherein the third door comprises an actuator configured to separate the shutter disk system from the factory interface.

13. The substrate processing system of claim 11, wherein the factory interface is configured to transfer a shutter disk from the shutter disk system to the at least one of the two or more process stations.

14. The substrate processing system of claim 11, wherein the shutter disk system further comprises a cooling system comprising a heat exchanging device disposed on at least one of the plurality of faces, a base, and a top.

15. The substrate processing system of claim 14, wherein the cooling system comprises a purge gas system or a cooling plate.

16. The substrate processing system of claim 11, wherein the shutter disk system further comprises a radiative heater source or a resistive heater source.

17. The substrate processing system of claim 11, wherein the shutter disk stack further comprises a rack identifier.

18. The substrate processing system of claim 11, the operational region comprises a pressure of about 1 Torr to about 780 Torr and the interlock region comprises a pressure of about 1 Torr to about 780 Torr.

19. The substrate processing system of claim 11, wherein the interior volume comprises one or more sensors, and the one or more sensors comprises a temperature sensor or a metrology sensor.

* * * * *